(12) United States Patent
Tokuyama et al.

(10) Patent No.: US 8,675,364 B2
(45) Date of Patent: Mar. 18, 2014

(54) POWER MODULE AND POWER CONVERSION DEVICE

(75) Inventors: Takeshi Tokuyama, Hitachi (JP); Kinya Nakatsu, Hitachinaka (JP); Ryuichi Saito, Hitachi (JP); Toshiya Satoh, Hitachiota (JP); Hideaki Ishikawa, Mito (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 148 days.

(21) Appl. No.: 13/266,675

(22) PCT Filed: Apr. 16, 2010

(86) PCT No.: PCT/JP2010/056872
§ 371 (c)(1),
(2), (4) Date: Dec. 13, 2011

(87) PCT Pub. No.: WO2010/125935
PCT Pub. Date: Nov. 4, 2010

(65) Prior Publication Data
US 2012/0087095 A1 Apr. 12, 2012

(30) Foreign Application Priority Data
Apr. 28, 2009 (JP) .................................. 2009-108653

(51) Int. Cl.
*H05K 7/20* (2006.01)
(52) U.S. Cl.
USPC ........... 361/715; 361/704; 361/718; 361/719; 165/185; 363/141
(58) Field of Classification Search
USPC ................. 361/699, 702–704, 714, 720–721; 165/104.33, 185; 363/141
See application file for complete search history.

(56) References Cited

U.S. PATENT DOCUMENTS 3,205,555 A * 9/1965 Balde et al. .................. 29/25.42
5,277,788 A * 1/1994 Nitowski et al. .............. 205/175
(Continued)

FOREIGN PATENT DOCUMENTS

JP 9-102580 A 4/1997
JP 2005-57212 A 3/2005
(Continued)

OTHER PUBLICATIONS

English machine translation of Takenaka etal., Japanese publication JP 2007-142067, dated Jun. 7, 2007, translated on Jul. 7, 2013.*

(Continued)

*Primary Examiner* — Robert J Hoffberg
(74) *Attorney, Agent, or Firm* — Crowell & Moring LLP

(57) ABSTRACT

A power module according to the present invention includes: a semiconductor element for converting DC current to AC current by switching operation; an electrical wiring board to which the semiconductor element is electrically connected, with the semiconductor element being disposed upon one of its principal surfaces; an insulating resin layer provided on the other principal surface of the electrical wiring board; a first insulation layer that is disposed opposite from the electrical wiring board, separated by the insulating resin layer, and that is joined to the insulating resin layer; a second insulation layer that is disposed opposite from the insulating resin layer, separated by the first insulation layer, and that ensures electrical insulation of the semiconductor element; and a metallic heat dissipation member that is disposed opposite from the first insulation layer, separated by the second insulation layer, and that radiates heat generated by the semiconductor element via the electrical wiring board, the insulating resin layer, the first insulation layer, and the second insulation layer.

10 Claims, 18 Drawing Sheets

(56) References Cited

U.S. PATENT DOCUMENTS

| | | | |
|---|---|---|---|
| 5,282,952 A * | 2/1994 | Sakaki | 205/153 |
| 6,542,365 B2 * | 4/2003 | Inoue | 361/699 |
| 2005/0150771 A1 * | 7/2005 | Kock et al. | 205/172 |
| 2005/0230816 A1 | 10/2005 | Kurauchi et al. | |

FOREIGN PATENT DOCUMENTS

| | | |
|---|---|---|
| JP | 2005-159048 A | 6/2005 |
| JP | 2005-310987 A | 11/2005 |
| JP | 2006-202899 A | 8/2006 |
| JP | 2007-53295 A | 3/2007 |
| JP | 2007-142067 A | 6/2007 |
| JP | 2008-193867 A | 8/2008 |

OTHER PUBLICATIONS

International Search Report dated Jun. 29, 2010 (two (2) pages).

* cited by examiner

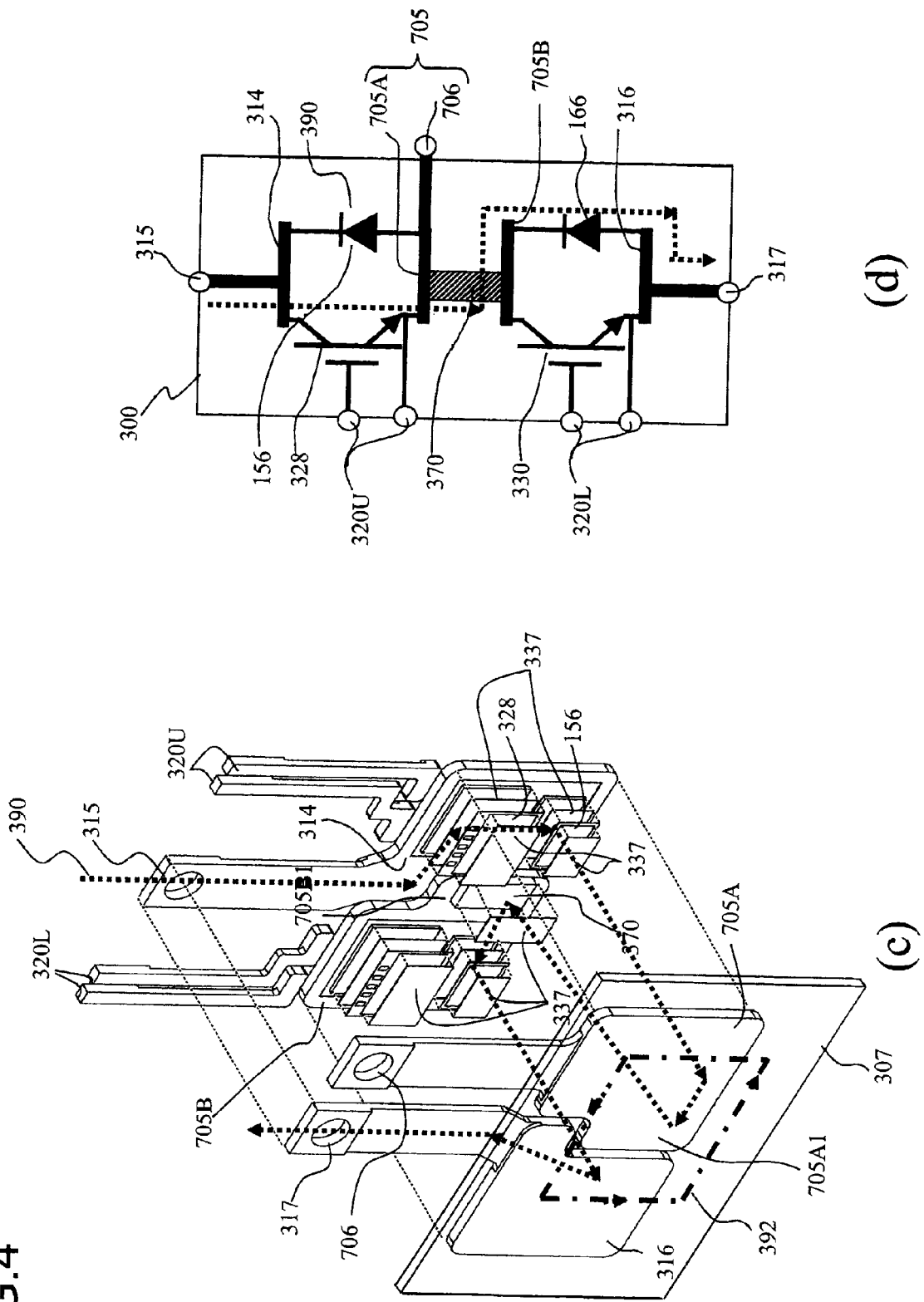

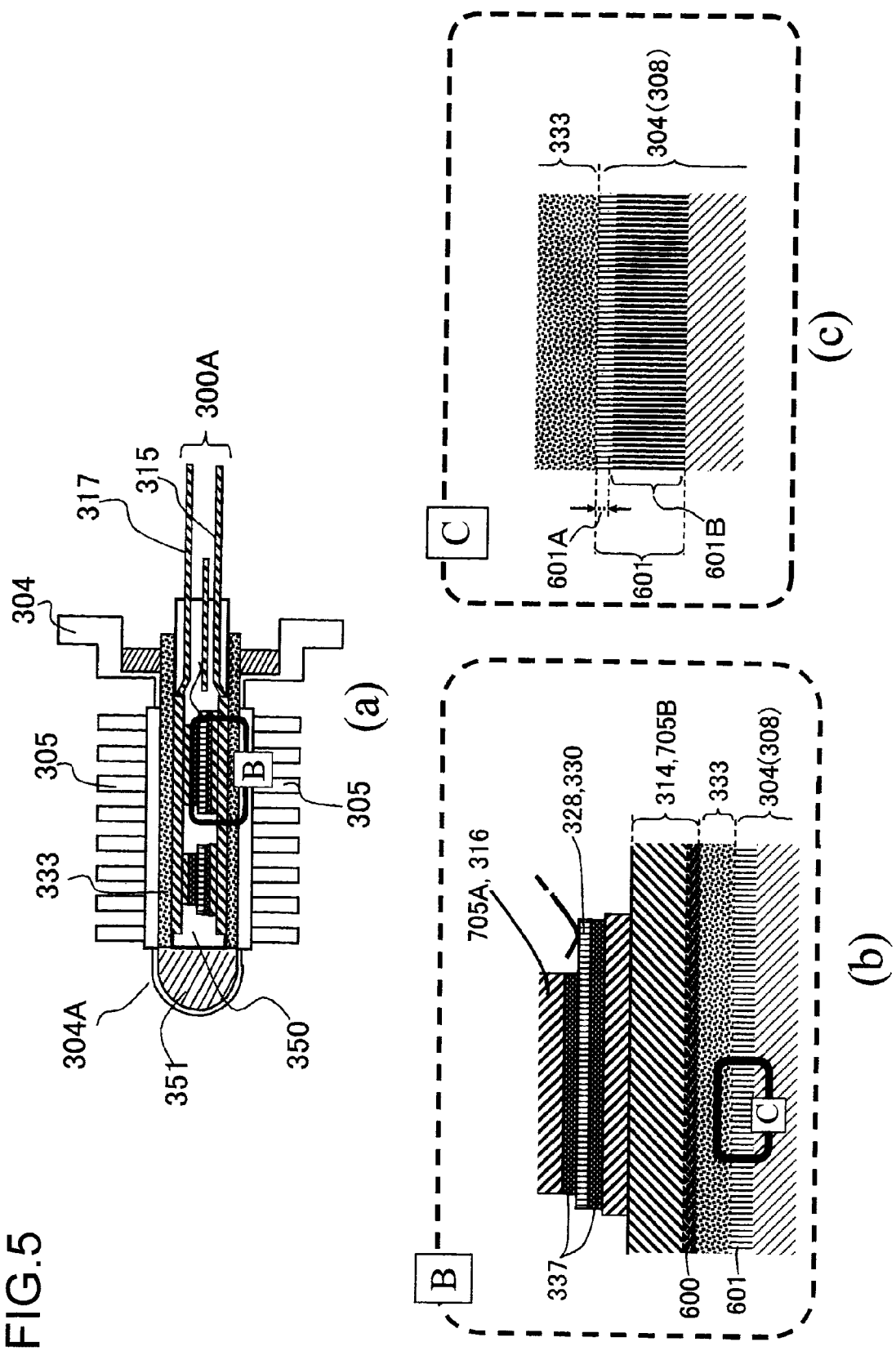

POWER MODULE AND POWER CONVERSION DEVICE

TECHNICAL FIELD

The present invention relates to a power module that internally houses an inverter circuit, and to a power conversion device that incorporates such a power module.

BACKGROUND ART

With a prior art power module of the type that is cooled on both sides, electrical wiring, an insulation layer, and a cooling device are provided on one principal surface upon which electrodes of internal power semiconductor elements are formed, and also electrical wiring, an insulation layer, and a cooling device are provided, in a similar manner, on its other principal surface as well. A heat dissipation base and fins are formed on the side opposite to the side where the power semiconductor devices are placed, which, moreover, are dipped into the water passage housing internal to the cooling device described above, in which a cooling water passage is formed by sealing with resin material, through which the fins become in direct contact with the cooling medium and thus the heat generated by the power semiconductor device is dissipated from both principal surfaces via the cooling device. The structure like this for enhancing the cooling performance and the productivity is disclosed in Patent Documents #1 through #3.

In Patent Document #1, a power module is described of a type that is cooled on only one side and with which heat is dissipated from one principal side thereof, including electrical wiring, an insulation layer, and a cooling device on one principal surface of power semiconductors, and in which a cooling device is adhered to the electrical wiring with an insulating adhesive and an inorganic insulation layer is formed at the interface between the insulating adhesive and the cooling device, so that the insulation performance is enhanced by this double layer insulation material consisting of the insulating adhesive and the inorganic insulation layer.

With a prior art power conversion device, since heat is generated by the power semiconductors that are provided at the upper side of the cooling device for the power module, accordingly a construction is required in which a heat dissipation base and fin portions are provided to the cooling device, and the cooling medium flows directly over the fin portions so as to cool them. However, with electric vehicles and so on that are becoming widespread, there is a requirement for yet further increase of output and for yet further reductions in size of the power conversion device. It is necessary to enhance the cooling performance in order to implement increase of output and reduction in size, and for this it is necessary use power semiconductors that are large in order to increase the areas of their cooling surfaces, and thus to lower the thermal resistance. While, by increasing the size of the power semiconductors, it is possible to reduce the thermal resistance with respect to the cooling medium by increasing the heat dissipation area, on the other hand the size of the power conversion device increases along with increase in size of the power semiconductors, and at the same time the productivity is also deteriorated. As a means for enhancing the productivity, there is an expedient of omitting a brazing process by changing the insulation material from the ceramic that is used in the prior art to an adhesive insulating resin material. However, the insulation performance of the resin insulation material itself is inferior as compared to a ceramic, and, since permeation of the cooling medium or moisture from outside exerts a negative influence upon the performance for adhesion to the cooling device and upon the insulating performance, accordingly there is a problem in the field of application to in-vehicle devices, for which high reliability is demanded.

The constructions disclosed in Patent Documents #1 through #3 are constructions in which various insulation layers are interposed between the electrical wiring and the cooling device using an organic type insulation material, of which resin material is representative, and there is the problem of deterioration of the insulation due to mechanical stress and other complex types of stress along with changes in the temperature of the environment of use.

With the construction disclosed in Patent Document #4, there is the problem that heat dissipation is performed from only one surface of the power semiconductors, so that the cooling performance is low. Moreover, no sealing between the internal electronic components and the cooling medium is described. If the cooling medium should seep in, then the adhesive strength of the insulating adhesive and the insulation performance between the insulating adhesive and the inorganic insulation layer itself will deteriorate, and as a result it will become impossible to maintain the insulation performance of the insulating substrate. This is a problem in the field of equipment for vehicles, for which high reliability is demanded. In particular, it is very important for organic materials such as insulating adhesives, of which resin is representative.

CITATION LIST

Patent Literature

Patent Document #1: Japanese Laid Open Patent Publication 2005-57212;
Patent Document #2: Japanese Laid Open Patent Publication 2007-53295;
Patent Document #3: Japanese Laid Open Patent Publication 2008-193867;
Patent Document #4: Japanese Laid Open Patent Publication 2005-159048.

SUMMARY OF INVENTION

Technical Problem

The problem that the present invention sets out to solve is to enhance the insulation reliability of a power module and of a power conversion device including this module.

Solution to Problem

According to the 1st aspect of the present invention, a power module comprises: a semiconductor element for converting DC current to AC current by switching operation; an electrical wiring board to which the semiconductor element is electrically connected, with the semiconductor element being disposed upon one of its principal surfaces; an insulating resin layer provided on the other principal surface of the electrical wiring board; a first insulation layer that is disposed opposite from the electrical wiring board, separated by the insulating resin layer, and that is joined to the insulating resin layer; a second insulation layer that is disposed opposite from the insulating resin layer, separated by the first insulation layer, and that ensures electrical insulation of the semiconductor element; and a metallic heat dissipation member that is disposed opposite from the first insulation layer, separated by the second insulation layer, and that radiates heat generated by the semiconductor element via the electrical wiring board, the insulating resin layer, the first insulation layer, and the second insulation layer.

According to the 2nd aspect of the present invention, in a power module according to the 1st aspect, it is preferred that a thickness of the second insulation layer is formed to be greater than a thickness of the first insulation layer.

According to the 3rd aspect of the present invention, in a power module according to the 1st or 2nd aspect, it is preferred that the metallic heat dissipation member is made from an aluminum alloy; the first insulation layer is formed upon the metallic heat dissipation member by performing alumite processing of an inorganic acid type upon the metallic heat dissipation member; and the second insulation layer is formed upon the metallic heat dissipation member by performing alumite processing of an organic acid type upon the metallic heat dissipation member.

According to the 4th aspect of the present invention, in a power module according to the 2nd or 3rd aspect, it is preferred that the alumite processing that is performed for the second insulation layer is alumite processing with phosphoric acid or oxalic acid.

According to the 5th aspect of the present invention, a power module comprises: a semiconductor element for converting DC current to AC current by switching operation; a first electrical wiring board, arranged so as to oppose a main electrode that is on one side of the semiconductor element, and electrically connected to the semiconductor element; a second electrical wiring board, arranged so as to oppose a main electrode that is on the other side of the semiconductor element, and electrically connected to the semiconductor element; insulating resin layers disposed on both sides of the semiconductor element, each arranged to be between the semiconductor element and the first or second electrical wiring board; a first insulation layer formed by alumite processing for adhering to the insulating resin layer, separated by the insulating resin layer; a second insulation layer for ensuring electrical insulation of the semiconductor element, separated by the first insulation layer; and metallic heat dissipation members for radiating heat generated by the semiconductor element, disposed on both sides of the semiconductor element, each separated by the first electrical wiring board or the second electrical wiring board, the insulating resin layer, the first insulation layer, and the second insulation layer.

According to the 6th aspect of the present invention, in a power module according to the 5th aspect, it is preferred that the metallic heat dissipation member is made from an aluminum alloy; the first insulation layer is formed upon the metallic heat dissipation member by performing alumite processing of an inorganic acid type upon the metallic heat dissipation member; and the second insulation layer is formed upon the metallic heat dissipation member by performing alumite processing of an organic acid type upon the metallic heat dissipation member.

According to the 7th aspect of the present invention, a power module comprises: a semiconductor element for converting DC current to AC current by switching operation; a first electrical wiring board, arranged so as to oppose a main electrode that is on one side of the semiconductor element, and electrically connected to the semiconductor element; a second electrical wiring board, arranged so as to oppose a main electrode that is on the other side of the semiconductor element, and electrically connected to the semiconductor element; a sealing resin mass that seals the semiconductor element, the first electrical wiring board, and the second electrical wiring board, so that portions of the surfaces of the first electrical wiring board and the second electrical wiring board on their surfaces that do not face the semiconductor element are exposed; a metallic casing having an aperture for insertion of the semiconductor element, the first electrical wiring board, and the second electrical wiring board, that is sealed by the sealing resin mass; and an insulation sheet that is inserted between a exposed surface of the first electrical wiring board and the second electrical wiring board, and an inner wall of the metallic casing; wherein, upon the metallic casing, a first insulation layer for adhering to the insulation sheet is formed upon a surface that faces the insulation sheet and the metallic casing, and a second insulation layer is formed opposite from the insulation sheet, separated by the first insulation layer.

According to the 8th aspect of the present invention, in a power module according to the 7th aspect, it is preferred that the metallic casing is made from an aluminum alloy; the first insulation layer is formed upon the metallic casing by performing alumite processing of an inorganic acid type upon the metallic casing; and the second insulation layer is formed upon the metallic casing by performing alumite processing of an organic acid type upon the metallic casing.

According to the 9th aspect of the present invention, in a power module according to the 1st aspect, it is preferred that the electrical wiring board is made from a Cu alloy, and, on its principal surface that faces the insulating resin layer, is subjected to oxidization processing such as roughening processing or blackening processing or the like.

According to the 10th aspect of the present invention, in a power module according to the 5th aspect, it is preferred that the first electrical wiring board and the second electrical wiring board are made from a Cu alloy, and, on their principal surfaces that face the insulating resin layers, are subjected to oxidization processing such as roughening processing or blackening processing or the like.

According to the 11th aspect of the present invention, in a power module according to the 7th aspect, it is preferred that the first electrical wiring board and the second electrical wiring board are made from a Cu alloy, and, on their principal surfaces that face the insulating resin layers, are subjected to oxidization processing such as roughening processing or blackening processing or the like.

Advantageous Effects of Invention

According to the present invention, it is possible to enhance the insulation reliability of a power module and of a power conversion device including this module.

BRIEF DESCRIPTION OF DRAWINGS

FIG. 4(a) is an exploded sectional view of this power module 300 according to an embodiment of the present invention;

FIG. 4(b) is an exploded perspective view of this power module 300 according to an embodiment of the present invention;

FIG. 4(c) is an exploded perspective view for explanation of the arrangement of switching elements of this power module 300 according to an embodiment of the present invention, and of the flow of current therein;

FIG. 5(*a*) is an exploded sectional view of this power module 300 according to an embodiment of the present invention; FIG. 5(*b*) is an enlarged view of a portion B of FIG. 5(*a*), and is a detailed sectional view that includes an adhesion interface between an insulation sheet 333 and electrical wiring boards and an adhesion interface between the insulation sheet 333 and the interior plane surface 308 of a can type cooling device 304; and FIG. 5(*c*) is an enlarged view of a portion C of FIG. 5(*b*), and is a detailed sectional view of the adhesion interface between the insulation sheet 333 and the electrical wiring boards, and of the adhesion interface between the insulation sheet 333 and the interior plane surface 308 of the can type cooling device 304;

DESCRIPTION OF EMBODIMENTS

Power modules that are cooled upon both sides according to various embodiments of the present invention, and power conversion devices that incorporate such modules, will now be explained in detail with reference to the drawings. Such a power conversion devices according to an embodiment of the present invention may be applied to a hybrid vehicle or to a pure electric vehicle.

Here, as a representative example, for a case in which a power conversion device according to an embodiment of the present invention is applied to a hybrid automobile, the control structure and the circuit structure of the power conversion device will be explained using FIGS. 1 and 2.

In connection with a power module that is cooled upon both sides according to an embodiment of the present invention, and with a power conversion device that uses such a power module, a power conversion device for use in an in-vehicle electrical system that is mounted to an automobile, and in particular an inverter device for propelling a vehicle that is used in an electrical system for driving the vehicle, whose mounting environment and operational environment is extremely severe, will be described and explained by way of example. Such an inverter device for vehicle driving is provided to an electrical system for vehicle driving as a control device for controlling the operation of an electric motor for driving the vehicle, and converts DC power supplied from an in-vehicle battery or from an in-vehicle electricity generation device that constitutes an in-vehicle power supply into predetermined AC power, and supplies the AC power that has thus been obtained to the electric motor for driving the vehicle, thus controlling the driving of this electric motor for propelling the vehicle. Moreover, since this electric motor for driving the vehicle also is endowed with the function of acting as a generator, the inverter device for vehicle driving is also endowed with the function of converting AC power that is generated by the electric motor for driving the vehicle into DC power. This DC power that has thus been converted is supplied to the in-vehicle battery.

It should be understood that while the structure of this embodiment is optimum as a power conversion device for driving a vehicle such as an automobile or a truck or the like, it could also be applied to a power conversion device of some other type. For example, it could also be applied to a power conversion device for driving an electric train or ship or aircraft or the like, to a power conversion device for industrial use as a control device for an electric motor that drives a machine in a workplace, or to a power conversion device for household use that is employed as a control device for an electric motor that drives a home solar energy generation system or that drives a household electrical product.

Embodiment 1

Figure 1:
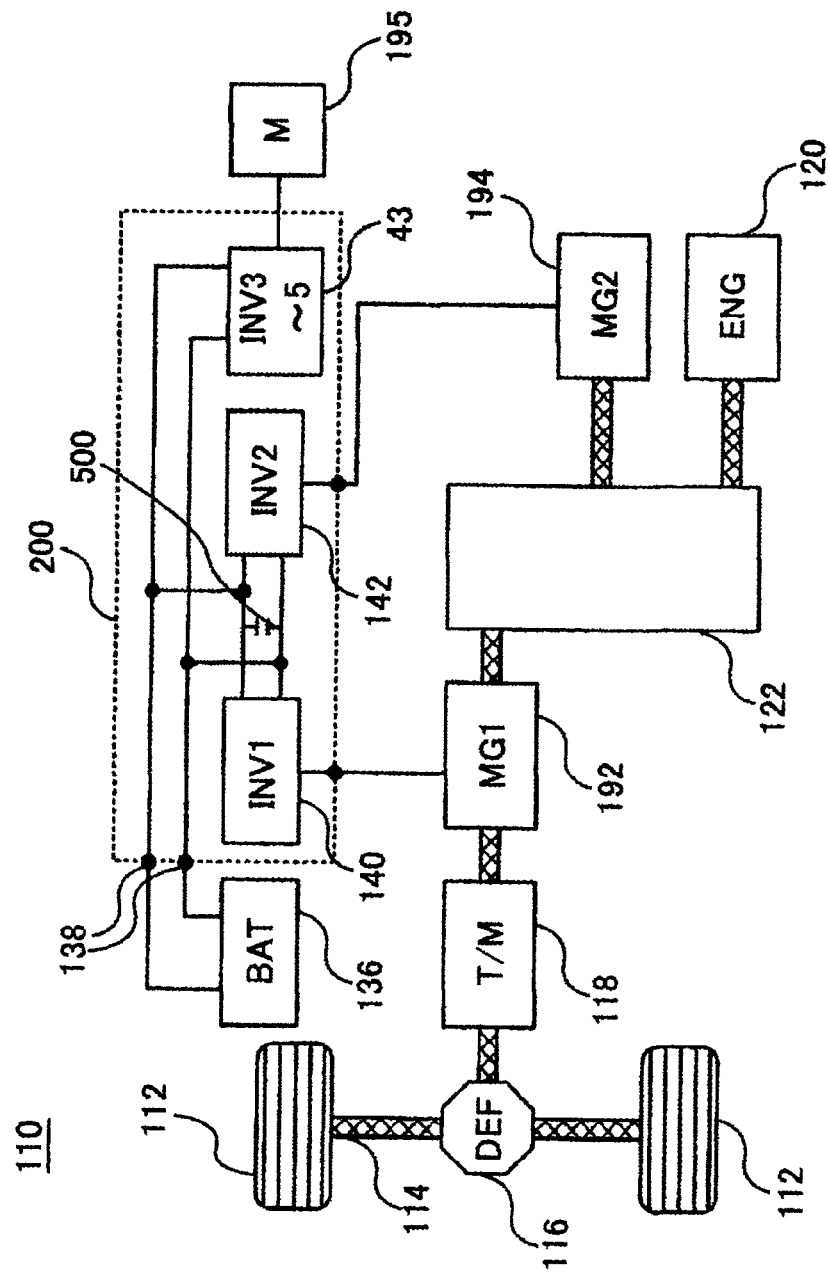
FIG. 1 is a figure showing control blocks of a hybrid automobile.
Figure 2:
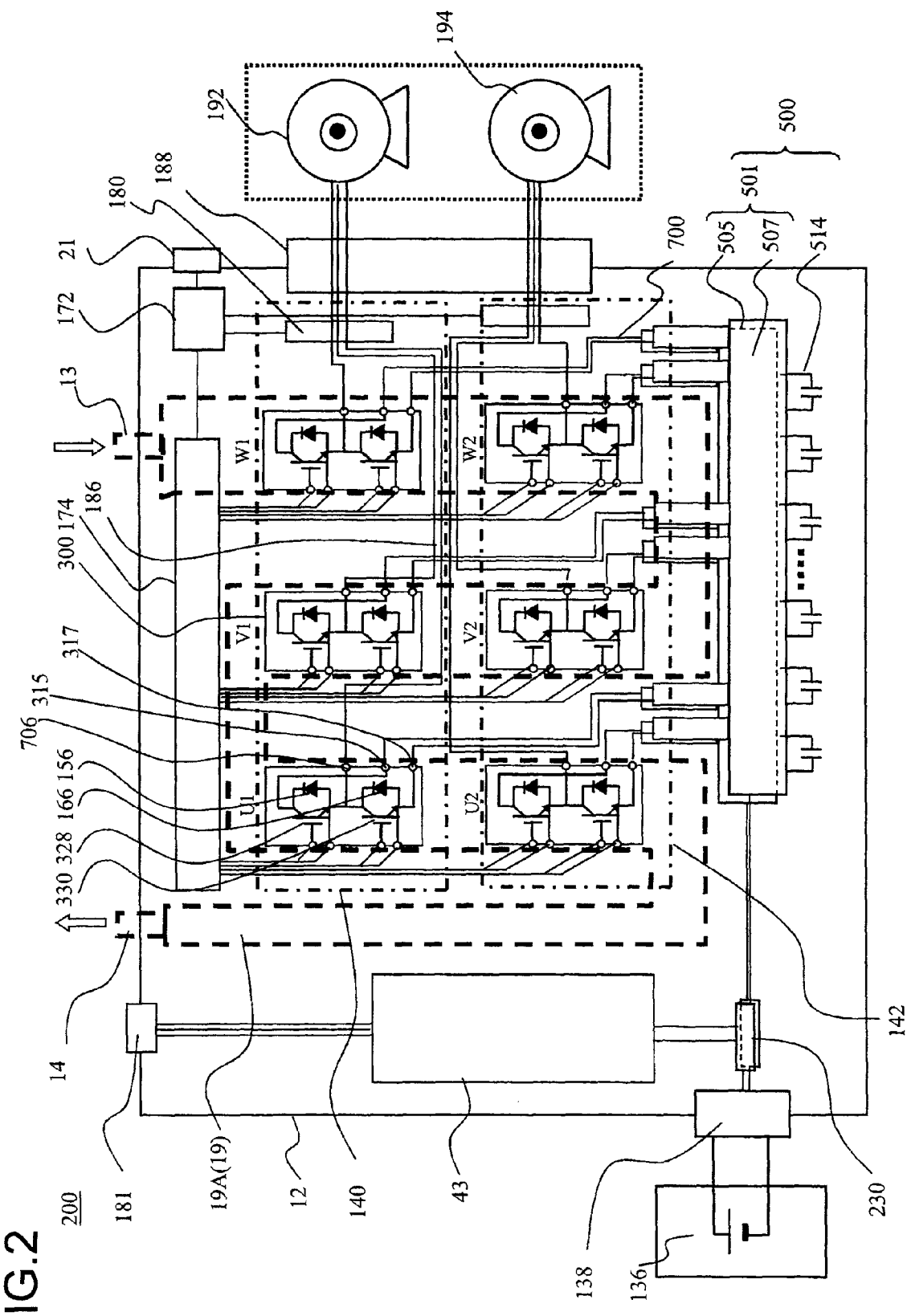
FIG. 2 is a figure for explanation of the circuit structure of a power conversion device 200.

FIG. 1 is a figure showing control blocks of a hybrid vehicle. In FIG. 1, a hybrid electric vehicle (hereinafter termed a HEV) 110 is a kind of electrically powered vehicle that includes two systems for vehicle driving. One of these systems is an engine system that employs an engine 120, that is an internal combustion engine, as a power source. This engine system is principally used as a source of driving power for the HEV 110. The other system is an in-vehicle electric motor system that employs a motor-generator MG1 192 and a motor-generator MG2 194 as power sources. The in-vehicle electric motor system is principally used as a driving source for the HEV 110 and as a power generation source for the HEV 110. The motor-generators MG1 192 and MG2 194 may be, for example, synchronous machines or induction machines, and since they can be used both as motors and as generators depending upon the manner in which they are operated, in this specification they will be termed "motor-generators".

Front wheel axles 114 are rotatably supported at the front portion of the vehicle body. And a pair of front wheels 112 are provided at the ends of these front wheel axles 114. Moreover, rear wheel axles (not shown in the figure) are rotatably supported at the rear portion of the vehicle body. And a pair of rear wheels are provided at the ends of these rear wheel axles. While, with the HEV of this embodiment, the so called front wheel drive configuration is employed in which the main wheels that are driven by power are the front wheels 112, while the auxiliary wheels that free wheel are the rear wheels, it would also be possible to employ the opposite configuration, in other words the rear wheel drive configuration.

A front wheel side differential gear 116 (hereinafter referred to as the front wheel side DEF) is provided at the central portion between the front wheel axles 114. The front wheel axles 114 are mechanically connected to the output sides of this front wheel side DEF 116. And the output shaft of a transmission 118 is mechanically connected to the input side of the front wheel side DEF 116. The front wheel side DEF 116 is a differential type power distribution mechanism that distributes the rotational drive force transmitted to the left and right front wheel axles 114 from the transmission 118 after it has been speed changed thereby. And the output side of the motor-generator 192 is mechanically connected to the input side of transmission 118. Moreover, the output side of the engine 120 and the output side of the motor-generator 194 are mechanically connected to the input side of the motor-generator 192 via a power distribution mechanism 122. It should be understood that the motor-generators 192 and 194 and the power distribution mechanism 122 are housed internally to the casing of the transmission 118.

The motor-generators 192 and 194 are synchronous machines that incorporate permanent magnets in their rotors, and the operation of these motor-generators 192 and 194 is controlled by the AC power that is supplied to the armature windings of their stators being controlled by inverter circuit units 140 and 142. A battery 136 is connected to these inverter circuit units 140 and 142, and power can be transmitted between the battery 136 and the inverter circuit units 140 and 142.

In this embodiment, the HEV 110 includes a first electrical motor-generator unit that consists of the motor-generator 192 and the inverter circuit unit 140, and a second electrical motoro-generator unit consisting of the motor-generator 194 and the inverter circuit unit 142, and usage is divided between these units according to the operational situation. In other words, in a state in which the vehicle is to be driven by the power from the engine 120, if the drive torque for the vehicle is to be assisted, the second electrical motor-generator unit is caused to operate as a generating unit with the power from the engine 120 and to generate electricity, and the first electrical motor-generator unit is caused to operate as an electrical motor unit by the power obtained by this generation of electricity. Moreover, if in a similar state the speed of the vehicle is to be assisted, the first electrical motor-generator unit is caused to operate as a generating unit with the power from the engine 120 and to generate electricity, and the second electrical motor-generator unit is caused to operate as an electrical motor unit by the power obtained by this generation of electricity.

Furthermore, in this embodiment, by causing the first electrical motor-generator unit to operate as an electrical motor unit with the power of the battery 136, it is possible to drive the vehicle only with the power of the motor-generator 192. Yet further, in this embodiment, by causing the first electrical motor-generator unit or the second electrical motor-generator unit to operate as a generating unit with the power from the engine 120 or with power from the vehicle wheels and to generate electricity, it is possible to charge up the battery 136.

The battery 136 is also used as a power supply for driving a motor 195 for auxiliary machinery. This auxiliary machinery may, for example, be a motor that drives a compressor for an air conditioner or a motor that drives a hydraulic pump for control, and DC power supplied from the battery 136 to the power conversion device 200 is converted by a conversion device 43 for auxiliary machinery into AC power that is then supplied to the motor 195. The conversion device 43 for auxiliary machinery has functions similar to those of the inverter circuits 140 and 142, and controls the phase, the frequency, and the power of the AC that is supplied to the motor 195. For example, the motor 195 may be caused to generate torque by supply of AC power having a phase that leads with respect to the rotation of the motor 195. On the other hand, the motor 195 may be caused to operate as a generator by supply of AC power having a trailing phase, and in this case the motor 195 is operated in the regenerative braking mode. The control functions of this type of conversion device 43 for auxiliary machinery are the same as the control functions of the inverter circuit units 140 and 142. While the maximum power that can be converted by the conversion device 43 for auxiliary machinery is smaller than that of the inverter circuit units 140 and 142 because the capacity of the motor 195 is smaller than the capacities of the motor-generators 192 and 194, the circuit structure of the conversion device 43 for auxiliary machinery is fundamentally the same as the circuit structures of the inverter circuit units 140 and 142.

The inverter circuit units 140, 142, and 43 are in a close electrical relationship with a capacitor module 500. Furthermore, these units are identical with regard to features that they require as countermeasures against generation of heat. Moreover, it is desirable to make the volume of the devices as small as possible. From these aspects, the power conversion device 200 that will be described in detail hereinafter houses the inverter circuit units 140, 142, and 43 and the capacitor module 500 internally within the casing of that power conversion device 200. Due to this construction, it is possible to implement a power conversion device that is compact and whose reliability is high, while reducing the emitted noise and so on and also being able to reduce the number of harnesses.

Yet further, by housing the inverter circuit units 140, 142, and 43 and the capacitor module 500 internally within a single casing, advantageous effects are obtained with regard to simplification of the wiring and countermeasures against noise. Even further, it is possible to reduce the inductance of the circuit that connects the capacitor module 500 to the inverter circuit units 140, 142, and 43, so that, along with being able to reduce spike voltages, it is also possible to reduce the amount of heat that is generated and enhancement of the heat dissipation efficiency.

Next, the circuit structure of the power conversion device 200 will be explained using FIG. 2. As shown in FIG. 1, the power conversion device 200 includes the inverter circuit units 140 and 142, the conversion device 43 for auxiliary machinery, and the capacitor module 500.

Figure 3:
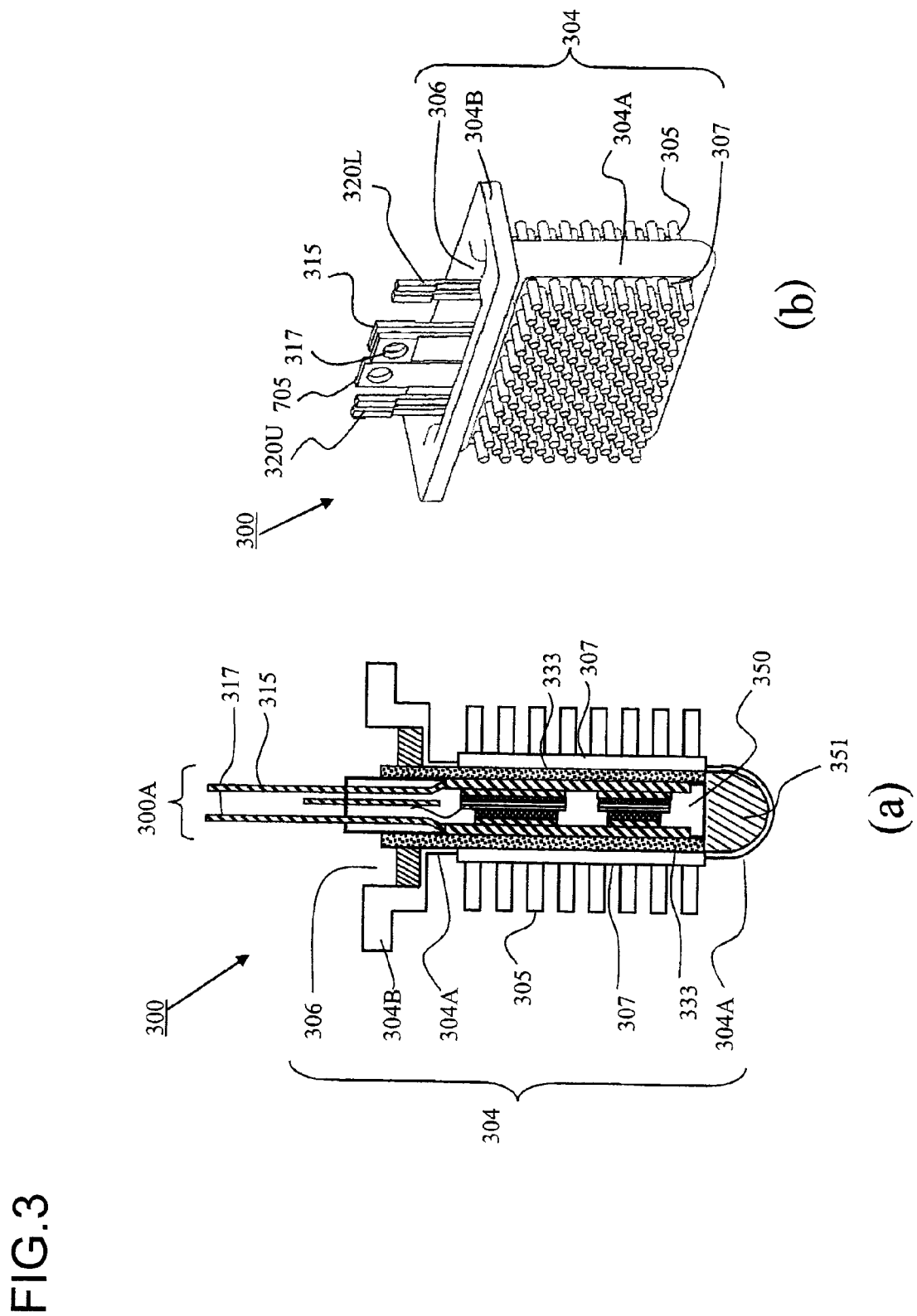
FIG. 3(a) is a sectional view of a power module 300 according to an embodiment of the present invention.
FIG. 3(b) is a perspective view showing the external appearance of this power module 300 according to an embodiment of the present invention.

Each of the inverter circuit units 140 and 142 is built as a three phase bridge circuit in which a plurality of power modules 300 that are cooled upon both sides are connected together. As will be described hereinafter, each of these power modules 300 includes power semiconductor elements for switching, wiring that connects to them, and a can-shaped heat dissipation base (hereinafter referred to as a can type cooling device) shown by 304 in FIG. 3, that is formed as a casing surrounding those elements except for an opening portion and so on. This can type cooling device 304 is a cooling device that has an outer wall made from a uniform material surrounding two mutually opposed heat dissipation bases and connected to both of the heat dissipation bases without any seams, with an opening portion being formed in a portion of this outer wall, and that houses the above power semiconductor elements in this opening portion. Moreover, the conversion device 43 for auxiliary machinery includes an inverter device and circuits for voltage stepping-up and stepping-down.

Each of the inverter circuit units 140 and 142 is drive controlled by one of two driver circuits that are provided to a control unit. In FIG. 2, the two driver circuits are shown together as a driver circuit 174. These driver circuits are controlled by a control circuit 172. The control circuit 172 generates switching signals for controlling the switching timings of the power semiconductor elements for switching.

The inverter circuit unit 140 is built as a three phase bridge circuit and incorporates, for each of a U phase (denoted by the reference symbol U1), a V phase (denoted by the reference symbol V1), and a W phase (denoted by the reference symbol W1), an upper arm circuit that is connected to a positive electrode side and a lower arm circuit that is connected to a negative electrode side. An upper arm-lower arm series circuit is formed by the upper arm circuit and the lower arm circuit. Each of the upper arm circuits includes an upper arm IGBT 328 (i.e. an insulated gate type bipolar transistor) that is a power semiconductor element for switching, and an upper arm diode 156. And each of the lower arm circuits includes a lower arm IGBT 330 and a lower arm diode 166. Each of these upper arm-lower arm series circuits is electrically connected to the capacitor module 500 and to the motor-generators 192 and 194 by a DC positive terminal 315, a DC negative terminal 317, and an AC terminal 706.

The IGBTs 328 and 330 operate upon receipt of drive signals that are outputted from one of the driver circuits 174A in the driver circuit 174, and convert DC power supplied from the battery 136 into three-phase AC power. The power that has thus been obtained by conversion is supplied to the armature winding of the motor-generator 192. It should be understood that the reference symbols 328, 330, 156, and 166 are not shown for the V phase and for the W phase. The power modules 300 of the inverter circuit unit 142 have a similar structure to those of the inverter circuit unit 140, and moreover those of the conversion device 43 for auxiliary machinery have a similar structure to those of the inverter circuit unit 142, and accordingly explanation thereof will be omitted.

In this embodiment, an example is shown in which the upper arm IGBTs 328 and the lower arm IGBTs 330 function as power semiconductor elements for switching. The upper arm IGBTs 328 and the lower arm IGBTs 330 have collector electrodes, emitter electrodes (emitter electrode terminals for signals), and gate electrodes (gate electrode terminals). The upper arm diodes 156 and the lower arm diodes 166 are electrically connected between the collector electrodes and the emitter electrodes of the upper arm IGBTs 328 and of the lower arm IGBTs 330, as shown in the figure. Each of the upper arm diodes 156 and the lower arm diodes 166 has two electrodes, a cathode electrode and an anode electrode, and their cathode electrodes are each electrically connected to the collector electrodes of the upper arm IGBTs 328 and of the lower arm IGBTs 330 while their anode electrodes are each electrically connected to the emitter electrodes of the upper arm IGBTs 328 and of the lower arm IGBTs 330, so that the directions from the emitter electrodes of the upper arm IGBTs 328 and of the lower arm IGBTs 330 towards their collector electrodes become their forward directions. It would also be acceptable to utilize MOSFETs (metallic oxide semiconductor field effect transistors) for the power semiconductor elements, and in this case the upper arm diodes 156 and the lower arm diodes 166 would not be required.

The control circuit 172 generates timing signals for controlling the switching timings of the upper arm IGBTs 328 and the lower arm IGBTs 330 on the basis of input information from a control device and sensors (for example a current sensor 180) and the like on the vehicle side. And, on the basis of these timing signals that are outputted from the control circuit 172, the driver circuit 174 generates drive signals for causing the upper arm IGBTs 328 and the lower arm IGBTs 330 to perform their switching operation.

The control circuit 172 includes a micro computer (hereinafter termed a "microcomputer") for performing processing to calculate the switching timings for the upper arm IGBTs 328 and the lower arm IGBTs 330. A requested target torque value for the motor-generator 192, values for the currents supplied from the upper arm-lower arm series circuits to the armature windings of the motor-generator 192, and the magnetic pole position of the rotor of the motor-generator 192, are inputted as input information to this microcomputer. The target torque value is a value based upon a command signal that is outputted from an upper control device, not shown in the figures. The current values are values detected on the basis of a detection signal that is outputted from the current sensor 180. And the magnetic pole position is a value that is detected on the basis of a detection signal outputted from a magnetic pole rotation sensor provided to the motor-generator 192, also not shown in the figures. While, in this embodiment, an example is presented and explained for a case in which the current values for the three phases are detected, it would also be acceptable to arrange to detect the current values for only two of the phases.

The microcomputer within the control circuit 172 calculates current command values for the d and q axes of the motor-generator 192 on the basis of the target torque value, and calculates voltage command values for the d and q axes on the basis of the differentials between these current command values for the d and q axes that have thus been calculated and the current values for the d and q axes that are detected. Furthermore, on the basis of the magnetic pole position that has been detected, the microcomputer converts these voltage command values for the d and q axes into voltage command values for the U phase, the V phase, and the W phase. And the microcomputer generates modulated waves in pulse form on the basis of comparison between the fundamental waves (sine waves) based upon these voltage command values for the U phase, the V phase, and the W phase and a carrier wave (a triangular wave), and outputs these modulated waves that it has generated to the driver circuit 174 as PWM (pulse width modulated) signals.

When driving a lower arm, the driver circuit 174 amplifies its PWM signal and outputs the result as a drive signal to the gate electrode of the corresponding lower arm IGBT 330. On the other hand, when driving an upper arm, the driver circuit 174 amplifies its PWM signal after having shifted the level of the reference potential of that PWM signal to the level of the reference potential of the upper arm, and outputs the result as a drive signal to the gate electrode of the corresponding upper arm IGBT 328. Due to this, the upper arm IGBTs 328 and the lower arm IGBTs 330 perform their switching operation on the basis of these drive signals.

Moreover, the control unit protects the upper arm-lower arm series circuits by performing anomaly detection (for excessive current, excessive voltage, excessive temperature, and so on). For this, sensing information is inputted to the control unit. For example, information specifying the currents flowing to the emitter electrodes of the upper arm IGBTs 328 and of the lower arm IGBTs 330 from the electrode terminals for signal emission for each arm is inputted to the corresponding driver circuits 174. Due to this, the driver circuit 174 performs excessive current detection, and stops the switching operation of the upper arm IGBTs 328 and of the lower arm IGBTs 330 if excessive current has been detected, so that the corresponding upper arm IGBTs 328 and the lower arm IGBTs 330 are protected from excessive current. Moreover, information specifying the temperatures of the upper arm-lower arm series circuit for each arm is inputted from temperature sensors (not shown in the figures) that are provided to the upper arm-lower arm series circuits to the microcomputer. Moreover, voltage information for the DC positive electrode side of each of the upper arm-lower arm series circuits is inputted to the microcomputer. The microcomputer performs excessive temperature detection and excessive voltage detection on this basis of this information, and stops the switching operation of all of the upper arm IGBTs 328 and the lower arm IGBTs 330 if excessive temperature or excessive voltage has been detected, thus protecting the upper arm-lower arm series circuits from excessive temperature and excessive voltage.

The operation of the upper arm IGBTs 328 and of the lower arm IGBTs 330 of the inverter circuit 140 to go continuous and to go discontinuous is changed over in a predetermined sequence, and the currents that are generated in the stator windings of the motor-generator 192 during this changing over flow in the circuits that include the diodes 156 and 166. It should be understood that while, with the power conversion device 200 of this embodiment, a single upper arm-lower arm series circuit is provided to each of the phases of the inverter circuit 140, a power conversion device would also be acceptable that has a circuit structure in which, for the circuits that generate outputs for each of the phases of the three phase AC outputted to the motor-generator, it is arranged to connect two upper arm-lower arm series circuits in parallel for each phase.

The DC terminals 315 and 317 that are provided to each of the inverter circuit units 140 and 142 (refer to FIGS. 2 and 3) are connected to a common laminated conductor plate 700. This laminated conductor plate 700 is built as a laminated wiring board having a three-layer construction, in which an insulation sheet (not shown in the figures) is sandwiched between a positive electrode side conductor plate 702 and a negative electrode side conductor plate 704, both of which are made from electrically conductive board that is wide in the direction in which the power modules are arranged. This positive electrode side conductor plate 702 and negative electrode side conductor plate 704 of the laminated conductor plate 700 are respectively connected to a positive electrode conductor plate 507 and to a negative electrode conductor plate 505 of a laminated wiring board 501. This positive electrode conductor plate 507 and this negative electrode conductor plate 505 are also made from electrically conductive board that is wide in the direction of arrangement of the power modules, and constitute a laminated wiring board of a three layer construction by sandwiching an insulation sheet (not shown in the figures) between them.

A plurality of capacitor cells 514 are connected in parallel in the capacitor module 500, and the positive electrode sides of these capacitor cells 514 are connected to the positive electrode conductor plate 507, while their negative electrode sides are connected to the negative electrode conductor plate 505. The capacitor module 500 is a smoothing circuit for suppressing DC voltage fluctuations generated due to the switching operation of the upper arm IGBTs 328 and of the lower arm IGBTs 330.

The laminated wiring board 501 of the capacitor module 500 is connected to an input laminated wiring board 230 that is connected to a DC connector of this power conversion device 200. And an inverter device that is provided in the conversion device 43 for auxiliary machinery is also connected to this input laminated wiring board 230. A noise filter is provided between the input laminated wiring board 230 and the laminated wiring board 501. Two capacitors (not shown in the figures) are provided to this noise filter so as to connect between the ground terminal of the casing 12 and the DC power lines, and these constitute a Y capacitor for common mode noise countermeasures.

The detailed structure of the power modules 300 that are included in the inverter circuits 140 and 142 will now be explained using FIGS. 3 through 10.

FIG. 3(a) is a sectional view of one of the power modules 300 of this embodiment, and FIG. 3(b) is a perspective view of that power module of this embodiment. And FIG. 4(a) is an exploded sectional view of this power module 300, while FIG. 4(b) is an exploded perspective view of the power module 300. Moreover, FIG. 4(c) is an exploded perspective view for explanation of the arrangement of the switching elements of this power module 300 and of the flow of current therein. And FIG. 4(d) is a schematic figure showing an upper arm-lower arm series circuit that is housed internally to this power module 300.

A can type cooling device 304 is made from an aluminum alloy material, for example Al, AlSi, AlSiC, AlC, or the like, and moreover is formed in a can type shape having no seams. Here, a "can type shape" means a rectangular parallelepiped shape that is provided with an opening for insertion 306 on one predetermined surface thereof, and that moreover has a bottom.

As shown in FIG. 4(a), the primary sealed module unit 300A contains an upper and lower arm circuit in its interior, and moreover this upper and lower arm circuit is sealed in with a first sealing resin mass 350. Insulation sheets 333 are inserted between the front and rear surfaces of the primary sealed module unit 300A and the can type cooling device 304. The DC positive terminal 315 and the DC negative terminal 317 are provided so that their principal surfaces mutually oppose one another, and are also electrically connected to the side of the capacitor module 500. A signal terminal 320U transmits a signal for driving the upper arm IGBT 328. Moreover, a signal terminal 320L transmits a signal for driving the lower arm IGBT 330. Since the upper arm IGBT 328 and the lower arm IGBT 330 are arranged within the primary sealed module unit 300A so as to be separated from one another, accordingly the signal terminals 320U and 320L are arranged according to the arrangement of those IBGTs so that they are separated from one another. And the AC terminal 706 is electrically connected to the motor-generators 192 and 194, and moreover is disposed between the signal terminal 320U and the DC positive terminal 315. The DC positive terminal 315, the DC negative terminal 317, and the signal terminals 320U and 320L project from the interior of this can type cooling device 304 to the exterior of this can type cooling device 304 via the insertion opening 306. The can type cooling device 304 has a flange 304B. The insertion opening 306 is formed in this flange 304B.

The can type cooling device 304 is built so as not to be provided with any openings, except for the insertion opening 306. Due to this, along with it being possible to make the terminals project from the aperture even though the can type cooling device 304 is inserted into a flow conduit in which cooling medium is flowing, it is also possible to prevent ingress of the cooling medium into the interior of the can type cooling device 304 with a simple structure.

Fins 305 are formed on the outer walls of mutually opposing heat dissipation bases 307 with which the can type cooling device 304 is provided. Moreover, the can type cooling device 304 has a curved portion 304A for connecting together these mutually opposing heat dissipation bases 307. This curved portion 304A is made from the same material as the heat dissipation bases 307 and is joined to them without any seams, and moreover is formed so as to surround the external peripheries of the heat dissipation bases 307. For example, in order to enhance the productivity, in this can type cooling device 304, the heat dissipation bases 307 and the curved portion 304A may be formed integrally. Furthermore, the heat dissipation bases 307 and the curved portion 304A may be joined together by welding, or may be stuck together with adhesive or the like. It should be understood that, since the thickness of this curved portion 304A is made to be thinner as compared with the thickness of the heat dissipation bases 307, so that the entire curved portion 304A itself can easily be deformed, accordingly the productivity after this primary sealed module unit 300A has been inserted is enhanced.

A DC positive electrode wiring board 314 shown in FIG. 4(c) is adhered by metallic joining material 337 to the collector side of the upper arm IGBT 328 and to the cathode side of the upper arm diode 156. And a first AC wiring board 705A shown in FIG. 4(c) is adhered by metallic joining material 337 to the emitter side of the upper arm IGBT 328 and to the anode side of the upper arm diode 156. It should be understood that, in this embodiment, a solder, a sheet silver, or a low temperature sintering joining material that includes minute metallic particles is employed for this metallic joining material 337. The DC positive electrode wiring board 314 and the first AC wiring board 705A are arranged approximately parallel to one another, facing one another with the upper arm IGBT 328 and the upper arm diode 156 sandwiched between them.

A second AC wiring board 705B shown in FIG. 4(c) is adhered by metallic joining material 337 to the collector side of the lower arm IGBT 330 and to the cathode side of the lower arm diode 166. And a DC negative electrode wiring board 316 shown in FIG. 4(c) is adhered by metallic joining material 337 to the emitter side of the lower arm IGBT 330 and to the anode side of the lower arm diode 166. The second AC wiring board 705B and the negative electrode wiring board 316 are arranged approximately parallel to one another, facing one another with the lower arm IGBT 330 and the lower arm diode 166 sandwiched between them.

The first AC wiring board 705A is provided with a wiring board portion 705A1 extending towards the side of the lower arm IGBT 330, and is not faced to the DC positive electrode wiring board 314. In a similar manner, the second AC wiring board 705B is provided with a wiring board portion 705B1 extending towards the side of the upper arm IGBT 328, and is not face to the DC negative electrode wiring board 316. The wiring board portion 705A1 and the wiring board portion 705B1 are made so as mutually to oppose one another, and moreover are adhered together by metallic joining material 337 via an intermediate metallic plate 370. The signal electrodes provided to the upper arm IGBT 328 and to the lower arm IGBT 330 are electrically connected by wire bonding (not shown in the figures) to the signal wiring boards 320U and 320L.

Next, reduction of the inductance of the wiring of the power module 300 according to this embodiment will be explained with reference to FIGS. 4(c) and 4(d). Since transient rises of voltage and large heat generation in the semiconductor chips occur during the switching operation of the upper arm and of the lower arm that constitute the inverter circuit, accordingly it is particularly desirable to reduce the inductance during switching operation. Since recovery currents 390 are briefly generated in the diodes, the operation for inductance reduction on the basis of these recovery currents will be explained by taking the recovery current in the diode 166 of the lower arm as an example.

The recovery current of the diode 166 is a current that flows in the diode 166 irrespective of whether there is any reverse bias, and it is generally considered to originate in carriers that are filled within the diode 166 in the forward direction state of the diode 166. Three phase AC power is generated at the AC terminals 706 of the inverter circuit by the continuity operation and the intercepting operation of the upper arm and the lower arm that make up the inverter circuit being performed in a predetermined sequence. At this time, when the upper arm IGBT 328 that is operating as the upper arm changes over from the continuous state to the intercepting state, return current flows via the diode 166 of the lower arm in the direction to maintain the currents in the stator windings of the motor-generators 192 and 194 (refer to FIG. 2). This return current is a current in the forward direction of the diode 166, and the interior of the diode is thereby filled with carriers. Next, when the upper arm IGBT 328 changes over from the intercepting state to the continuous state for a second time, a recovery current that originates in these carriers described above flows in the diode 166 for the lower arm. While in steady operation one or the other portion of the upper arm and lower arm series circuit is quite certainly in the intercepting state and no short-circuit currents flow in the upper and lower arms, in a transient state, currents, for example the recovery currents of the diodes, flow in the series circuit constituted by the upper and lower arms.

When the upper arm IGBT 328 of the upper arm-lower arm series circuit shown in FIGS. 4(c) and 4(d) changes from OFF to ON, the recovery current of the diode 166 flows from the DC positive terminal 315 via the upper arm IGBT 328 and the diode 166 to the DC negative terminal 317 (as shown by the arrow sign in the figure). It should be understood that, at this time, the lower arm IGBT 330 is in the intercepting state. Regarding this recovery current flowd, as shown in FIG. 4(c), in the path from the DC positive terminal 315, the upper arm IGBT 328, and the diode 166 to the DC negative terminal 317, the conductor plates are arranged in parallel in the vertical direction, and moreover the same current flows in them but in opposite directions. When this occurs, the magnetic fields generated by the mutually opposing currents in the space between the conductor plates come to cancel one another out, and as a result the inductance of the current path comes to be decreased.

In other words, operation to reduce the inductance occurs due to the existence of the laminated state in which the DC positive terminal 315 and the DC negative terminal 317 are brought close together and are arranged so as to oppose one another.

Furthermore, when the path of the recovery current shown in FIG. 4(c) is considered, after the reverse direction parallel current path, next a loop shaped path is described. Due to the current flowing in this loop shaped path, an eddy current 392 is caused to flow in the heat dissipation base 307, and this causes operation to occur to reduce the inductance of the loop shaped path, because of the beneficial effect of cancellation of the magnetic field due to this eddy current. It should be understood that this inductance reduction operation is increased, the closer the shape of the path of the recovery current is to the shape of a loop. In this embodiment, since the DC positive terminal 315 and the DC negative terminal 317 are in the state of being laminated together, accordingly the start point and the end point of the flow of current coincide with one another. Moreover, the upper arm IGBT 328 is arranged to be higher than the intermediate metallic plate 370 and the diode 166. Due to these features, the path of the recovery current is close to a loop shape, so that it is possible to increase the inductance reduction operation.

As described above, according to the arrangement of the circuit structure of the power module according to this embodiment, it is possible to reduce the inductance due to the beneficial effect of the laminated arrangement, and due to the beneficial effect provided by the eddy current. It is very important to reduce the inductance during switching operation, and, with the power module of this embodiment, the series circuit of the upper arm and the lower arm is stored within the semiconductor module. Due to this, it becomes possible to reduce the inductance of the diode that flows in the upper arm-lower arm series circuit and so on with respect to the recovery current, and the beneficial effect for reduction of the inductance in the transient state is great.

If the inductance is reduced, then the induced voltages generated in the power module become small, and it is possible to obtain a circuit structure that has little loss; and, furthermore, since the inductance is small, it is possible for this to be conducive to enhancement of the speed of switching.

Figure 4:
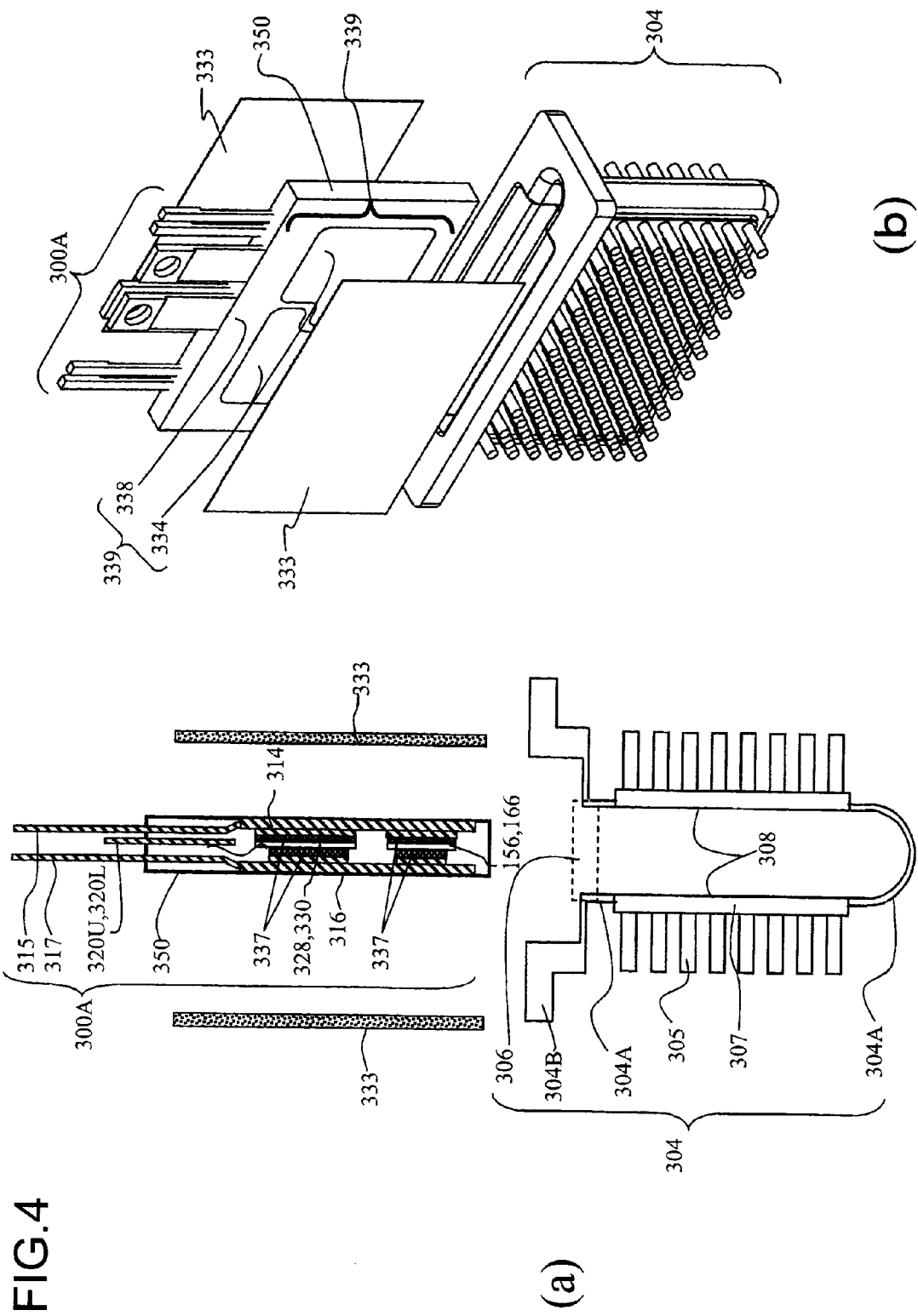
FIG. 4(*d*) is a schematic figure showing the series connection of an upper arm circuit and a lower arm circuit that is housed within this power module 300 according to an embodiment of the present invention.

Heat transfer surfaces 334 shown in FIG. 4(*b*) are formed on the surface on the opposite side to the surface to which the DC positive electrode wiring board 314, the DC negative electrode wiring board 316, and the power semiconductor elements of the first AC wiring board 705A and the second AC wiring board 705B are adhered. A flat portion 338 of the first sealing resin mass shown in FIG. 4(*b*) is made to lie in approximately the same surface as the heat transfer surfaces 334 described above. The heat transfer surfaces 334 and the flat portion 338 constitute a pressure sealing surface 339, and an insulation sheet 333 is adhered thereto by thermocompression bonding. By making the heat transfer surfaces 334 and the flat portion 338 lie in approximately the same surface, it is possible to prevent increase of the thermal transmission resistance without reducing the adhesive force between the first sealing resin mass 350 and the insulation sheet 333. Pressure sealing surfaces 339 are defined on both the front surface and the rear surface of this primary sealed module unit 300A.

It should be understood that, in the following, the DC positive electrode wiring board 314, the DC negative electrode wiring board 316, the first AC wiring board 705A, and the second AC wiring board 705B will generically be referred to as electrical wiring boards.

This primary sealed module unit 300A that includes the insulation sheets 333 is arranged so that the insulation sheets 333 and the internal plane surfaces 308 of the can type cooling device 304 face one another. It should be understood that alumite processing is performed upon the interior plane surfaces 308 of the can type cooling device 304, at least on the surfaces thereof which face the insulation sheets 333. Here, the insulation sheets are adhesive thin insulation sheets made from a mixture of epoxy resin blended with a thermally conductive filler. Moreover, it would also be acceptable for these insulation sheets 333 to be made from a combination of a plurality of insulation sheets with different amounts of filler.

And pressure is applied to the heat dissipation bases 307 of this can type cooling device 304, so that the primary sealed module unit 300A is sandwiched between the heat dissipation bases 307 of the can type cooling device 304 that face one another. In the state in which the insulation sheets 333 and the interior plane surfaces 308 that have been alumite processed are in contact with one another, the power module 300 is placed in a vacuum environment, and the insulation sheets 333 and the interior plane surfaces 308 are adhered together by thermocompression bonding. By doing this, the insulation sheets 333 function as insulating resin layers. Moreover, the only elements interposed between the power semiconductor elements that are the source of generation of heat and the heat dissipation bases 307 are the metallic junction material 337, the DC positive electrode wiring board 314 or the DC negative electrode wiring board 316, and the insulation sheet 333, and there is no interposition of grease or the like that has high thermal resistance. Due to this, it is possible greatly to enhance the performance for heat dissipation from the power semiconductor elements. Accordingly, along with it being possible to flow high current in these elements, it is also possible to prevent increase in the size of the elements. Therefore it is possible to promote compactness of this power module 300 and of this power conversion device.

FIGS. 5(*a*) through 5(*c*) are detailed sectional views of an adhesion interface between one of the insulation sheets 333 and one of the electrical wiring boards, and of an adhesion interface between this insulation sheet 333 and one of the internal surfaces 308 of the can type cooling device 304.

FIG. 5(*b*) is a detailed sectional view in which the portion B of FIG. 5(*a*) is enlarged. A roughened processed layer 600 is formed upon the heat transfer surface 334 of each of the electrical wiring boards shown in FIG. 4(*b*). By doing this, the adhesive force at the adhesion interface between the heat transfer surface 334 and the insulation sheet 333 is increased. It should be understood that, if the DC positive electrode wiring board 314, the DC negative electrode wiring board 316, the first AC wiring board 705A, and the second AC wiring board 705B are made from a Cu alloy, then it is appropriate for this roughened processed layer 600 to be produced by conventional roughening processing or by oxidation processing, such as blackening processing or the like.

On the other hand, if the DC positive electrode wiring board 314, the DC negative electrode wiring board 316, the first AC wiring board 705A, and the second AC wiring board 705B are made from an Al alloy, then it is appropriate to employ conventional roughening processing or oxidization processing by inorganic acid type alumite processing or the like, for which the hole diameter is large. Since due to this, when the insulation sheet 333 is thermocompression bonded, the raw material of the insulation sheet that has begun to be melted flows into and infiltrates the roughened portions of the roughened processed layer 600, accordingly the adhesive force between the electrical wiring boards and the insulation sheets 333 is enhanced. Moreover, since a compounding force due to chemical combination is created by flowing the raw material of the insulation sheets 333 into the roughened portions of the roughened processed layer 600 so that it infiltrates thereinto, accordingly the adhesive force between the electrical wiring boards and the insulation sheets 333 is further enhanced.

As previously described, alumite layers 601 are formed upon the interior plane surfaces 308 of the can type cooling device 304. Since these alumite layers and the insulation sheets 333 are joined together, accordingly the adhesive force between the can type cooling device 304 and the insulation sheets 333 is enhanced.

FIG. 5(*c*) is a detailed sectional view in which the portion C of FIG. 5(*b*) is enlarged. The alumite layer 601 is made of an inorganic acid type alumite layer 601A, that is a first insulation layer, formed on the side closer to the insulation sheet 333, and an organic acid type alumite layer 601B, that is a second insulation layer, formed on the opposite side to the insulation sheet 333, i.e. with this inorganic acid type alumite layer 601A between them. Furthermore, since no hole sealing processing is performed upon the alumite layer 601, accordingly the hole diameter of the inorganic acid type alumite layer 601A is around 300 to 400 Å, while on the other hand the hole diameter of the organic acid type alumite layer 601B is around 100 to 170 Å.

Since the hole diameter of the inorganic acid type alumite layer 601A is greater than the hole diameter of the organic acid type alumite layer 601B, accordingly, at the adhesion interface between the inorganic acid type alumite layer 601A and the insulation sheet 333, due to the thermocompression bonding, the raw material of the insulation sheet 333 can easily enter into and penetrate the holes of the inorganic acid type alumite layer 601A. Due to this, both a beneficial anchoring effect and a compounding force due to chemical combination take place at the adhesion interface between the inorganic acid type alumite layer 601A and the insulation sheet 333, so that it is possible to enhance the adhesive force. It should be understood that, if the inorganic acid type alumite layer 601A and the organic acid type alumite layer 601B have the hole diameters described above, then the average shear adhesion strength of the adhesion interface between the inorganic acid type alumite layer 601A and the insulation sheet 333 is greater than or equal to 20 Mpa.

Moreover, as shown in FIG. 5(c), it is arranged for the thickness of the organic acid type alumite layer 601B to be greater than the thickness of the inorganic acid type alumite layer 601A. Due to this, the insulation withstand voltage due to the organic acid type alumite layer 601B is enhanced. Furthermore, since the insulation sheet 333 and the organic acid type alumite layer 601B form a double layered insulating layer via the inorganic acid type alumite layer 601A, accordingly the insulating performance can be maintained even if a high voltage is applied to the power semiconductor elements.

Figure 6:
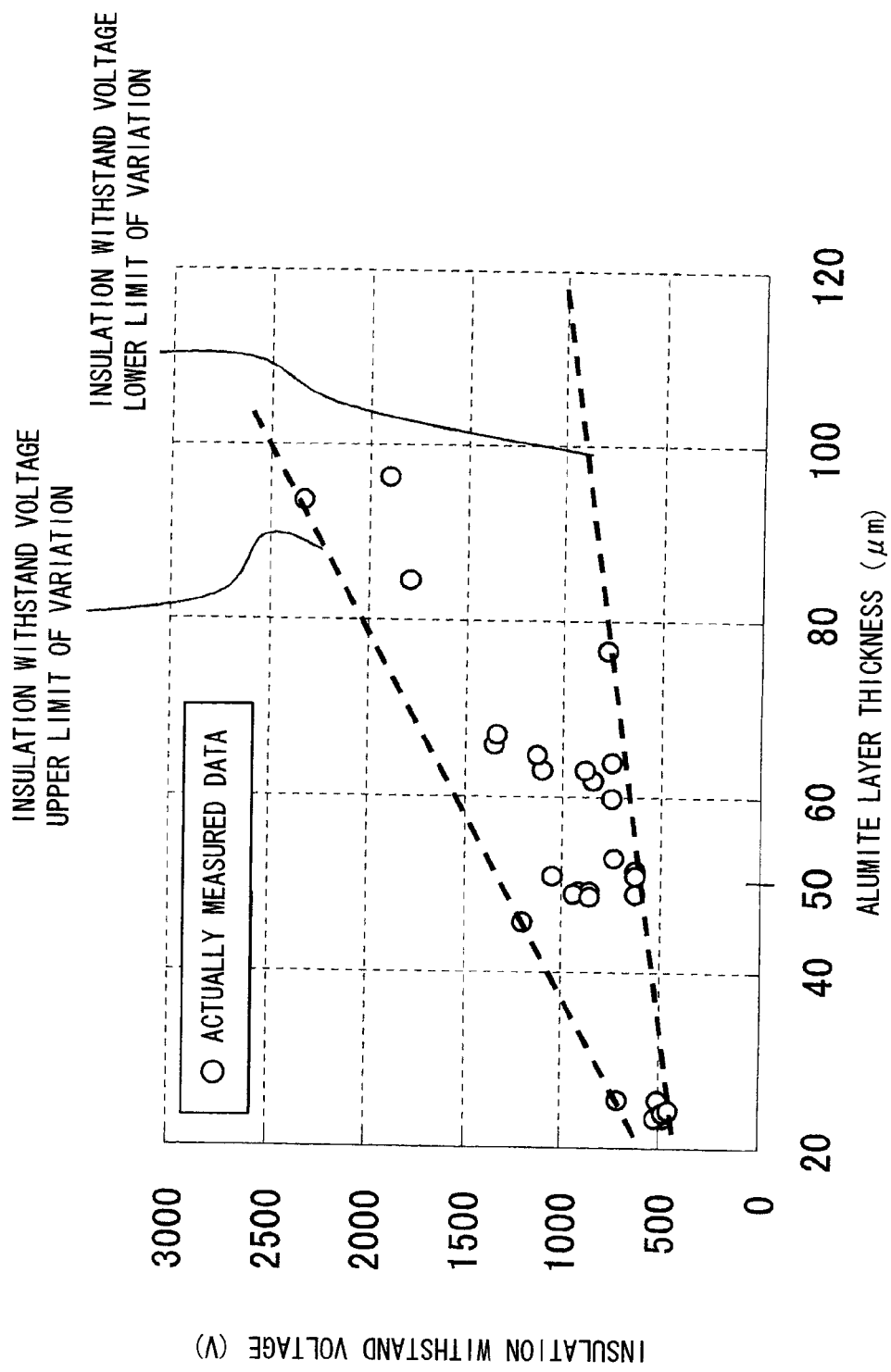
FIG. 6 is a figure showing actually measured data for the relationship between the thickness of an organic acid type alumite layer 601B and the insulation withstand voltage.

FIG. 6 is a figure showing actually measured data giving the relationship between the thickness of the organic acid type alumite layer 601B and the insulation withstand voltage. The thickness of the organic acid type alumite layer 601B is shown along the horizontal axis, and the insulation withstand voltage across the organic acid type alumite layer 601B is shown along the vertical axis.

As shown in FIG. 6, when the thickness of the organic acid type alumite layer 601B becomes great, while on the one hand the insulation withstand voltage is improved, on the other hand variations of the insulation withstand voltage also become large. Moreover, the processing time period for forming the organic acid type alumite layer 601B upon the can type cooling device 304 also becomes long.

When consideration is given to the maximum voltage to be applied to the power module 300 according to this embodiment, an insulation withstand voltage of 500 V or more is required. Furthermore, since it is necessary to provide three of these power modules in order to generate AC current for a three phase motor, as with the power conversion device of this embodiment, accordingly it is necessary to enhance the productivity for the power modules. Furthermore, in order to enhance the reliability of the insulation withstand voltage, it is desirable for the variations of the insulation withstand voltage to be small. Thus, it is desirable for the thickness of the organic acid type alumite layer 601B to be 50 µm.

Figure 7:
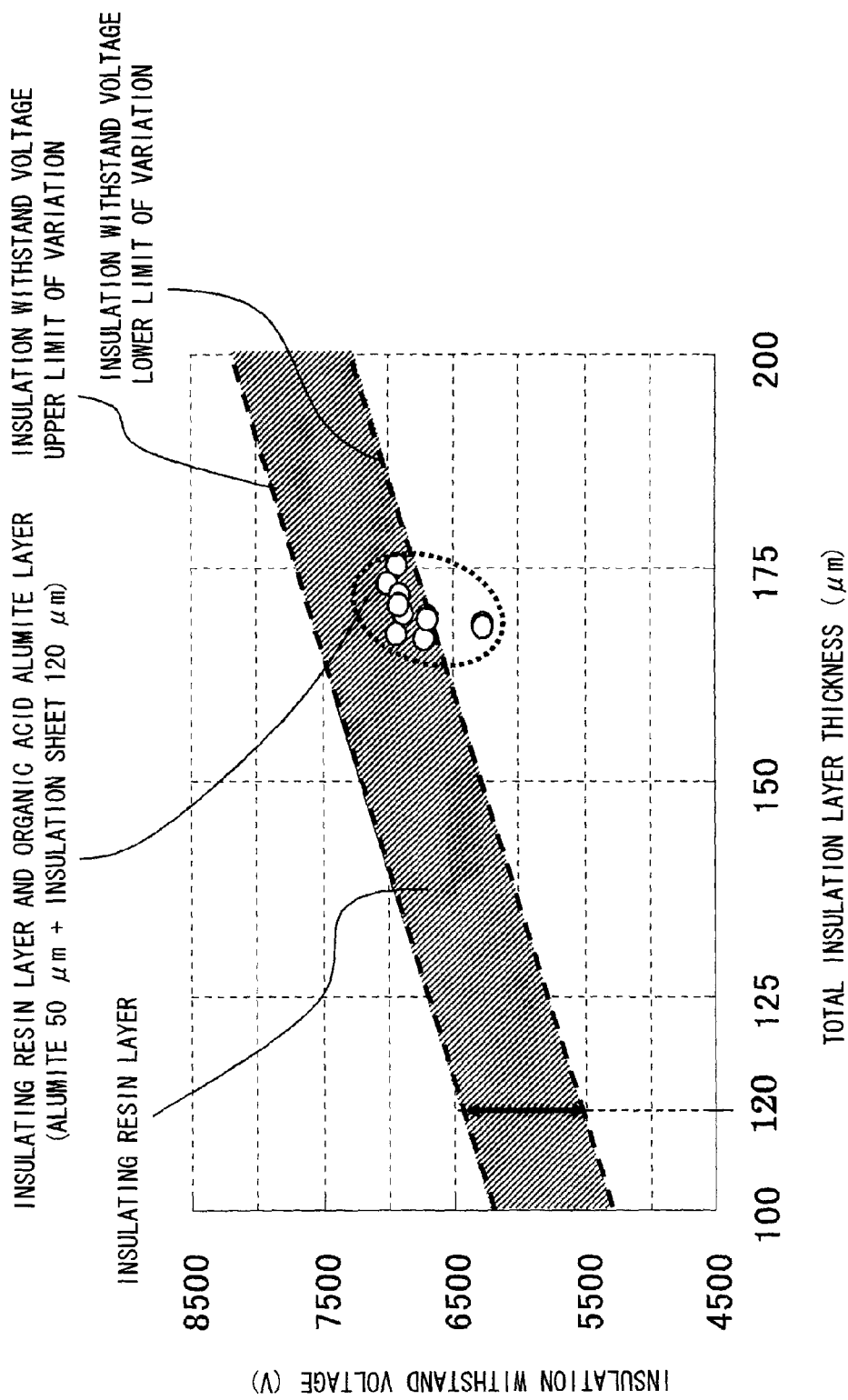
FIG. 7 is a figure showing actually measured data for the insulation withstand voltage from the insulation sheet 333 to the organic acid type alumite layer 601B.

FIG. 7 is a figure showing actually measured data for the insulation withstand voltage from the insulation sheet 333 to the organic acid type alumite layer 601B. The measurement conditions for this actually measured data were that the thickness of the inorganic acid type alumite layer 601A was around 0.5 µm, the thickness of the organic acid type alumite layer 601B was around 50 µm, and the thickness of the insulation sheet 333 was around 120 µm. It should be understood that thermocompression bonding was performed between the insulation sheet 333 and the inorganic acid type alumite layer 601A.

The insulation withstand voltage shown in FIG. 7 when the total thickness of the insulation layer is 120 µm shows the range of the insulation withstand voltage for only the insulation sheet 333 of thickness 120 µm. By contrast, the white dots plotted in FIG. 7 show the insulation withstand voltage when the organic acid type alumite layer 601B of thickness 50 µm is added. Due to this, even though the thickness of the insulation sheet 33 is 120 µm, the insulation withstand voltage range is enhanced to around 6200 to 7000 V, thus being enhanced by 500 V or more above the insulation withstand voltage of the insulation sheet 333 by itself.

Since it is possible to make the thickness of the insulation sheets 333 small while maintaining a high insulation withstand voltage in this manner, accordingly it is possible to reduce the thermal resistance of the insulation sheet 333 portions. Therefore, since the entire thermal resistance from the power semiconductor elements to the fins 305 is kept low, accordingly it is possible to transmit the heat generated by the power semiconductor elements to the fins 305 in an efficient manner. Moreover it is also possible, by making the thickness of the insulation sheets 333 smaller, to enhance the beneficial effect of reduction of the inductance by the eddy currents described above.

Figure 8:
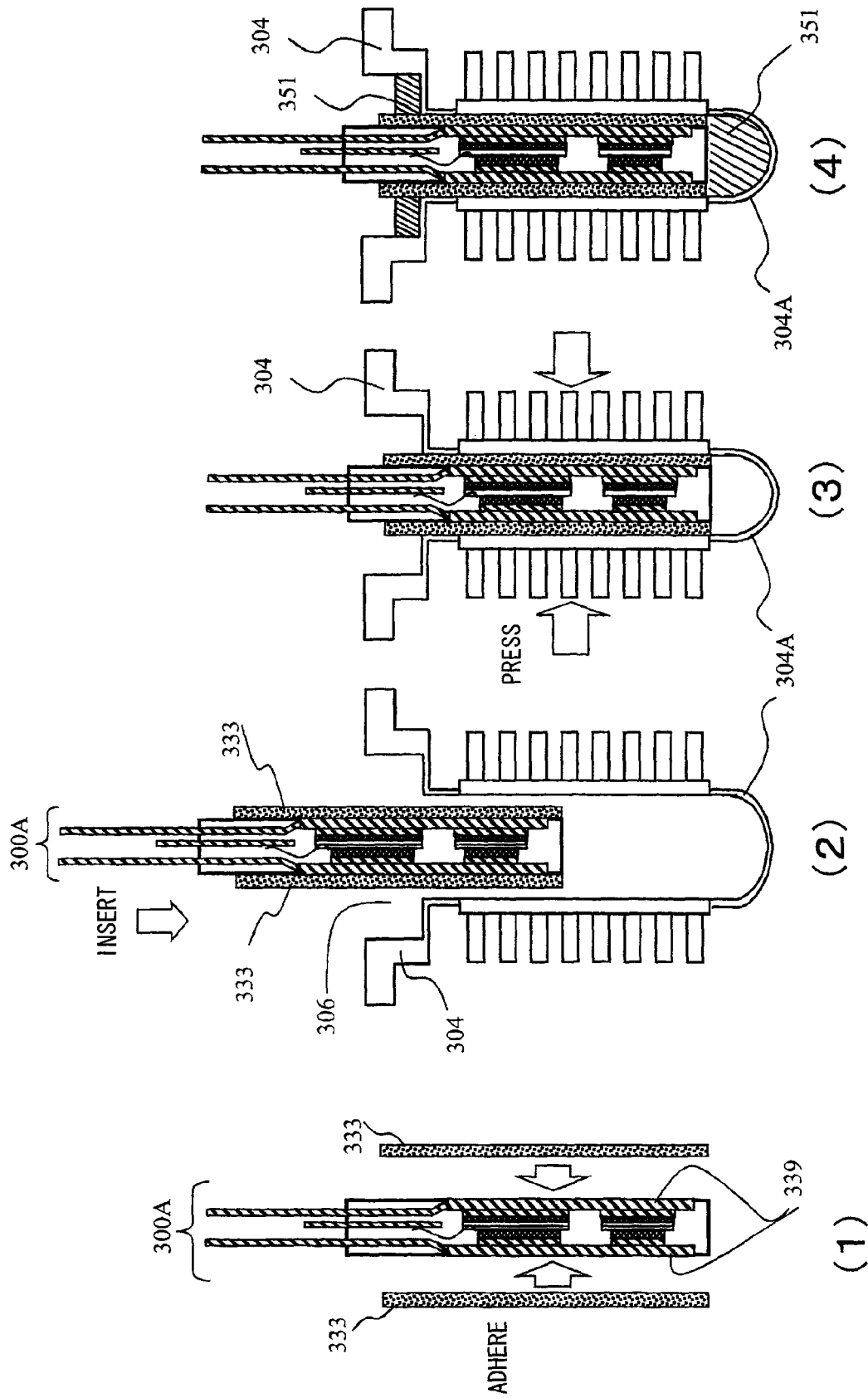
FIG. 8 is a figure for explanation of a thermocompression bonding process by which a primary sealed module unit 300A, to which insulation sheets 333 are provided, is adhered to the can type cooling device 304.

FIG. 8 is a figure for explanation of the thermocompression bonding process by which the primary sealed module unit 300A, to which the insulation sheets 333 are provided, is adhered to the can type cooling device 304.

As shown in FIG. 8(1), the two insulation sheets 333 are adhered by thermocompression bonding on the two sides of the primary sealed module unit 300A.

Next, as shown in FIG. 8(2), the primary sealed module unit 300A is inserted into the can type cooling device 304 through its insertion opening 306, and is arranged so that the insulation sheets 333 and the interior plane surfaces 308 upon which alumite processing has been performed face one another.

Next, as shown in FIG. 8(3), under a vacuum and at high temperature, pressure is applied to the can type cooling device 304 on its sides upon which the fins 305 are formed towards the primary sealed module unit 300A that is inserted into that can type cooling device 304. Due to this applied pressure, the curved portion 304A is slightly deformed, and the insulation sheets 333 and the interior plane surfaces 308 that have been subjected to alumite processing are contacted together. Since, as described above, the can type cooling device 304 is in a vacuum at high temperature at this time, accordingly an adhesive force comes to be created at the contacting interfaces between the insulation sheets 333 and the interior plane surfaces 308.

Next, as shown in FIG. 8(4), the space within the can type cooling device 304 that has not been occupied by the primary sealed module unit 300A and the insulation sheets 333 is charged with a second sealing resin mass 351.

Figure 9:
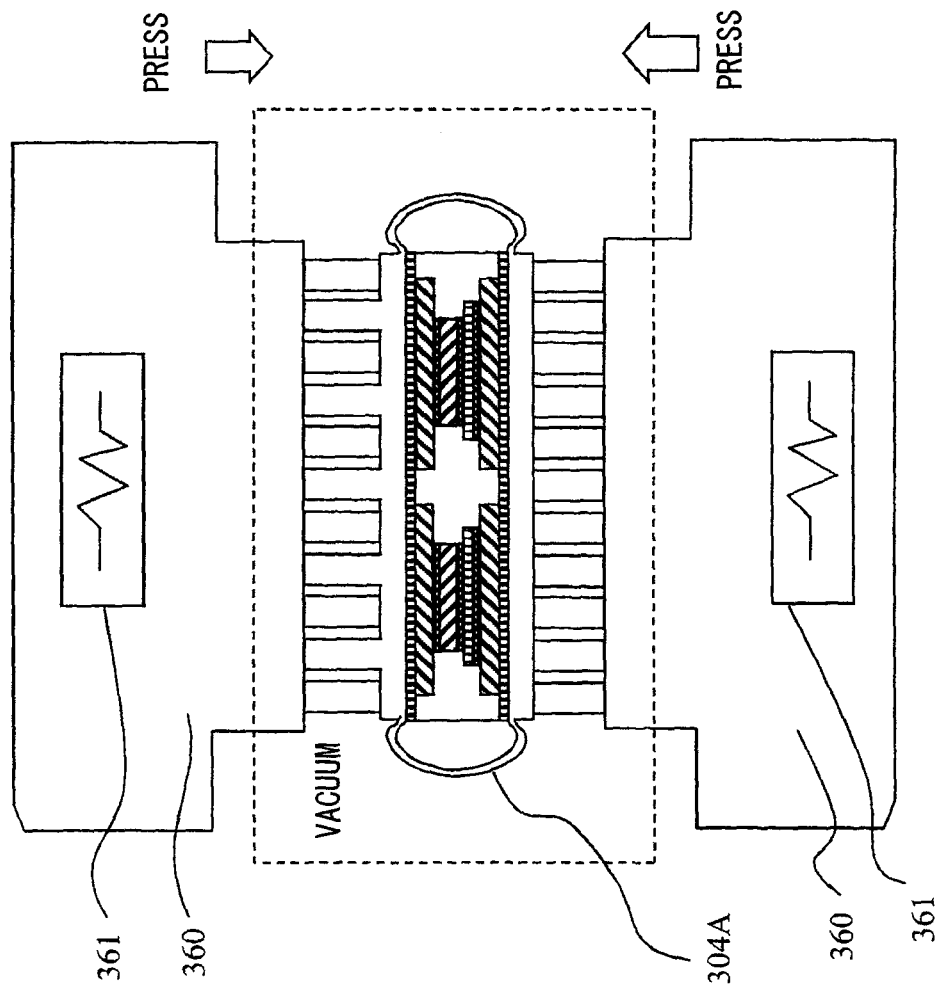
FIG. 9 is a figure for explanation of the details of an adhering step shown in FIG. 8(3) in which the insulation sheets 333 and the interior plane surfaces 308 of the can type cooling device 304 are adhered together under high temperature in a vacuum.

FIG. 9 is a figure for explanation of the details of the process shown in FIG. 8(3) in which the insulation sheets 333 and the interior plane surfaces 308 of the can type cooling device 304 are adhered together in vacuum and at high pressure. A press machine 360 includes heaters 361 in its interior. The can type cooling device 304 is pressurized by this press machine 360, so that its curved portion 304A is minutely deformed, and the insulation sheets 333 and the interior plane surfaces 308 upon which alumite processing has been performed are brought into mutual contact. By emitting heat from the heaters 361 in this state, the heat generated by these heaters 361 is transmitted to the insulation sheets 333 and to the interior plane surfaces 308 upon which alumite processing has been performed. Since, due to this, the process of applying pressure to the can type cooling device 304 and the process of thermocompression bonding of the insulation sheets 33 are performed successively, accordingly the productivity is greatly enhanced.

As described above, with the power module 300 according to this embodiment, by storing the primary sealed module unit 300A and the insulation sheets 333 in the can type cooling device 304 that is made from an aluminum alloy material or from a copper alloy material and that has no seams, it is possible to protect, from permeation of the cooling medium, the primary sealed module unit 300A, the insulation sheets 333, and the roughened processed layer 600 and the alumite layer 601 that are present at the adhesion interfaces between them. Due to this, it is possible to prevent deterioration of the insulation due to detachment of the adhesion interfaces or permeation of moisture therethrough, so that it is possible to ensure the reliability of the insulation performance.

In addition, the primary sealed module unit 300A is stored with the upper arm-lower arm circuit sealed in its interior, and so, by taking the upper arm-lower arm circuits as units, it is possible to increase the current capacity of the inverter devices 140 and 142 by using larger numbers of the power modules 300 in them, and accordingly this structure provides the capability of enhancing the compactness and also the current capacity. Due to this, it is possible to increase the current capacity so as to correspond to the type of the hybrid automobile, and also the productivity is enhanced.

Figure 10:
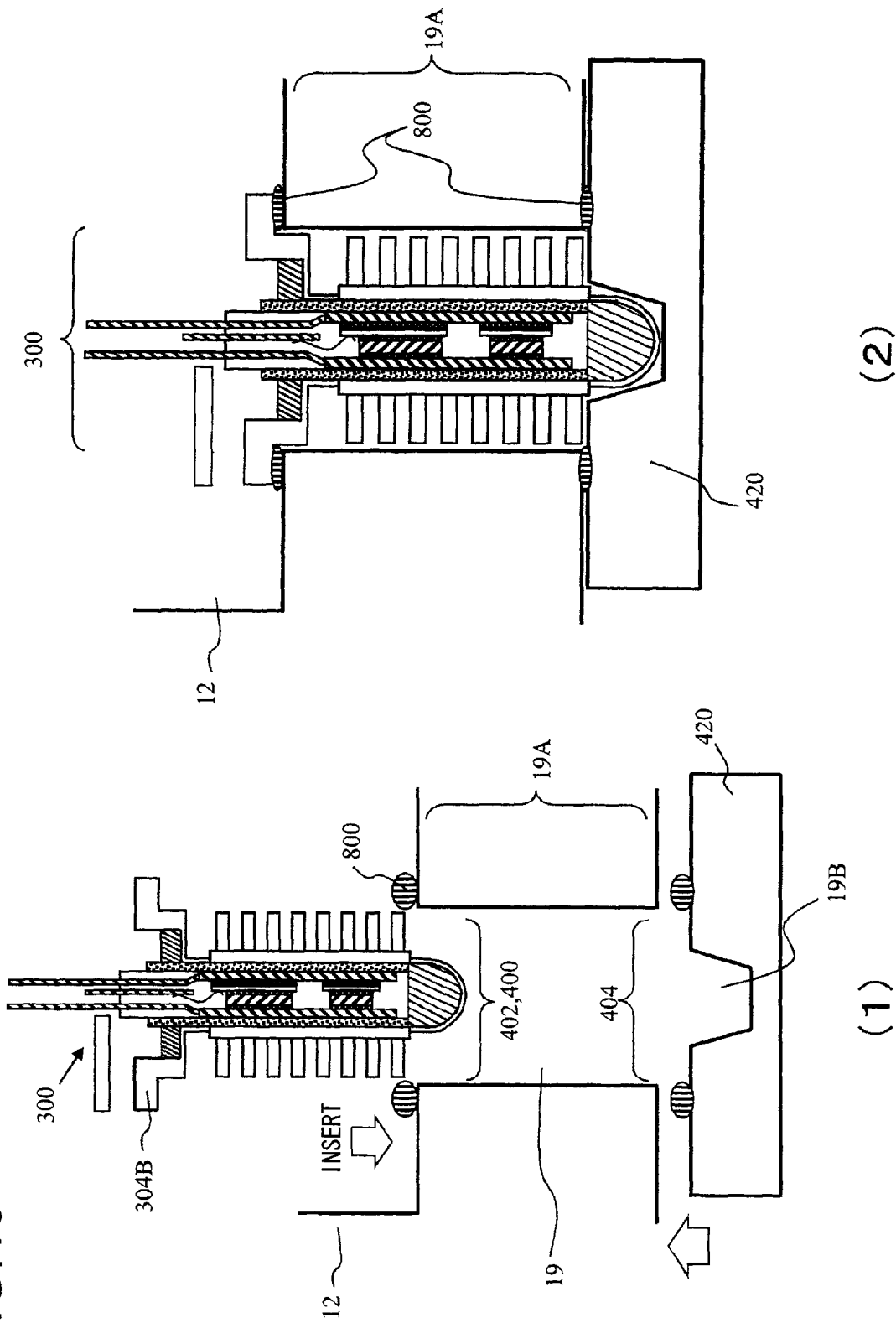
FIG. 10 is a figure for explanation of a process for fitting the power module 300 to a casing 12.

FIG. 10 is a figure for explanation of the process of fitting the power module 300 into the casing 12. The casing 12 includes a cooling jacket 19A in which is formed a flow conduit 19 through which a cooling medium flows. Openings are formed in the upper portion and the lower portion of this cooling jacket 19A, facing one another. A pair of opening portions 400 and 402 are defined by the power module 300 being fitted into the opening in the upper portion of the cooling jacket 19A. The opening in the lower portion is shown as an opening portion 404.

The power module 300 is inserted into the opening in the upper portion, so that the portion of the power module 300 upon which the fins 305 are formed is housed within the flow conduit 19. A sealing member 800 is sandwiched by the flange 304B and the cooling jacket 19A, and thus enhances the performance for sealing the flow conduit 19.

Furthermore, the aperture 404 is blocked by a flow conduit rear lid 420 with the interposition of a seal member. This flow conduit rear lid 420 is formed with a module fitting portion 19B into which the curved portion 304A of the power module 300 is fitted. Due to this module fitting portion 19B that is formed so that the curved portion 304A fits thereinto, it becomes difficult for the cooling medium that flows within the flow conduit 19 to flow in the module fitting portion 19, while on the other hand it becomes easy for the cooling medium to flow around and between the fins 305. Due to this, it is possible to enhance the cooling efficiency of the power module 300.

Moreover, this primary sealed module unit 300A internally houses the upper arm IGBT 328 and the lower arm IGBT 330, and the upper arm diode 156 and the lower arm diode 166, that constitute the upper arm-lower arm circuit. And the main electrode surfaces of both of these power semiconductor elements are held between the DC positive electrode wiring board 314, the DC negative electrode wiring board 316, the first AC wiring board 705A, and the second AC wiring board 705B. On these wiring boards, their heat transfer surfaces 334 are formed on their surfaces that are on the opposite side to their surfaces on which their power semiconductor elements are arranged. These heat transfer surfaces 334 are exposed from the first sealing resin mass 350. Due to this, the heat generated by the power semiconductor elements can be dissipated from both of the main electrode surfaces of the power semiconductor elements. On the other hand, since the insulation sheets 333 are closely adhered to the heat transfer surfaces 334, accordingly, along with ensuring the insulation of the heat transfer surfaces 334 and of the can type cooling device 304, it is also possible to dissipate heat to the cooling medium from the fins 305 of the can type cooling device 304.

Due to this, the power module 300 becomes compact, since the thermal resistance of the power module 300 is decreased and accordingly it becomes possible to drive the motor-generators 192 and 194 with power semiconductor elements of smaller area.

A power conversion device that employs this power module 300 will now be explained using FIGS. 13 through 15.

Figure 13:
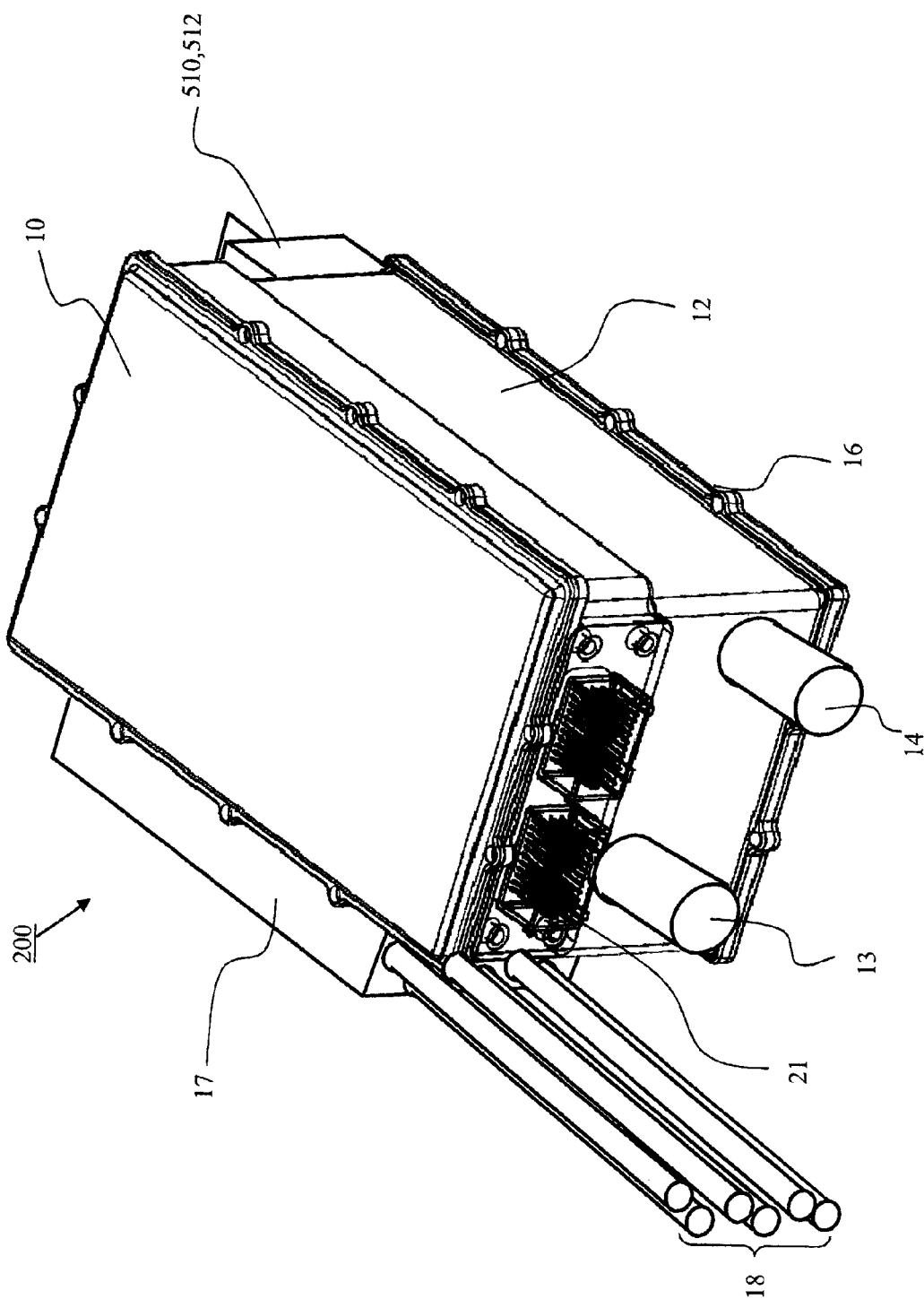
FIG. 13 is a perspective view showing the external appearance of this power conversion device 200 according to an embodiment of the present invention.
Figure 14:
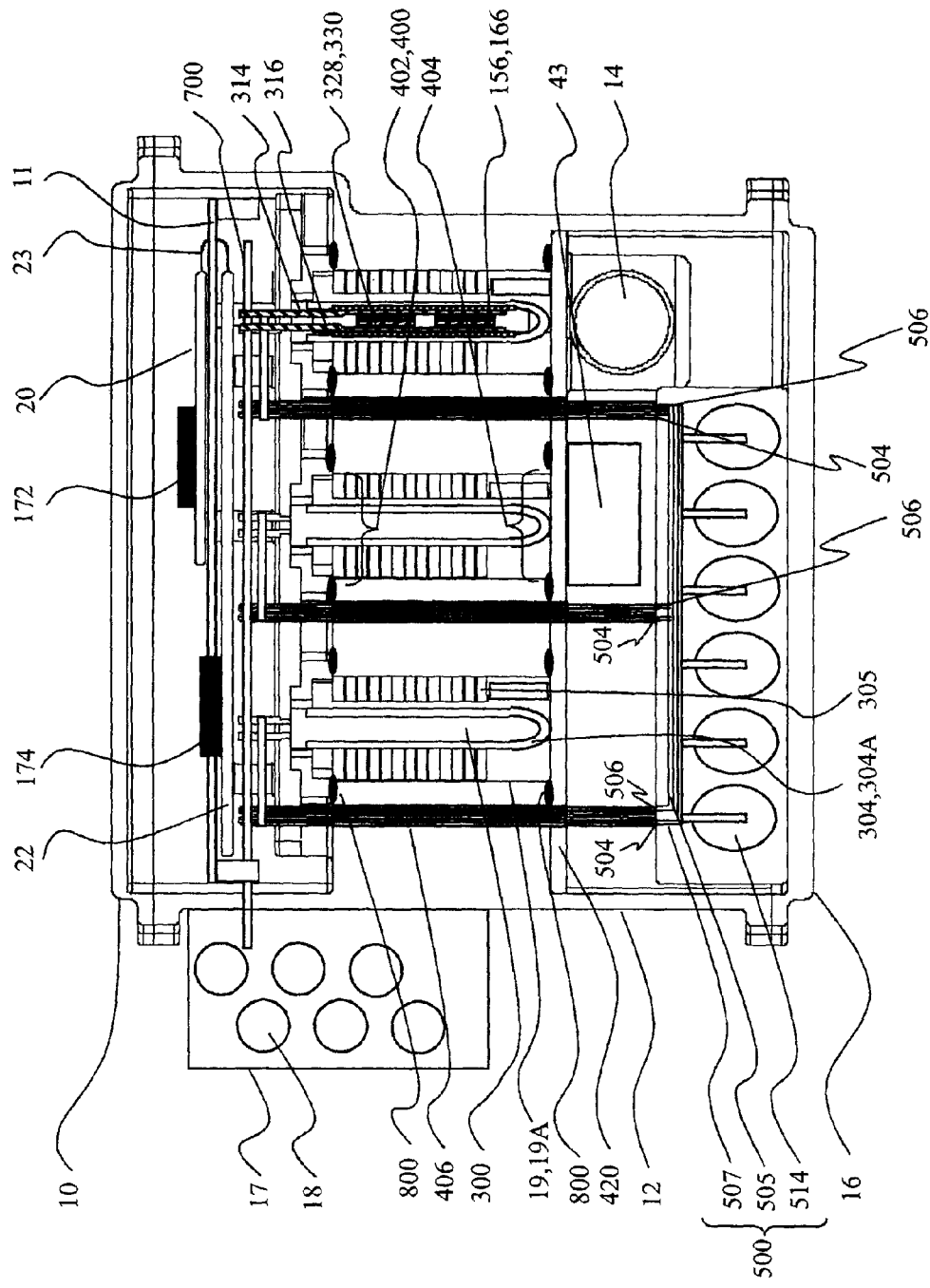
FIG. 14 is a sectional view of this power conversion device according to an embodiment of the present invention.
Figure 15:
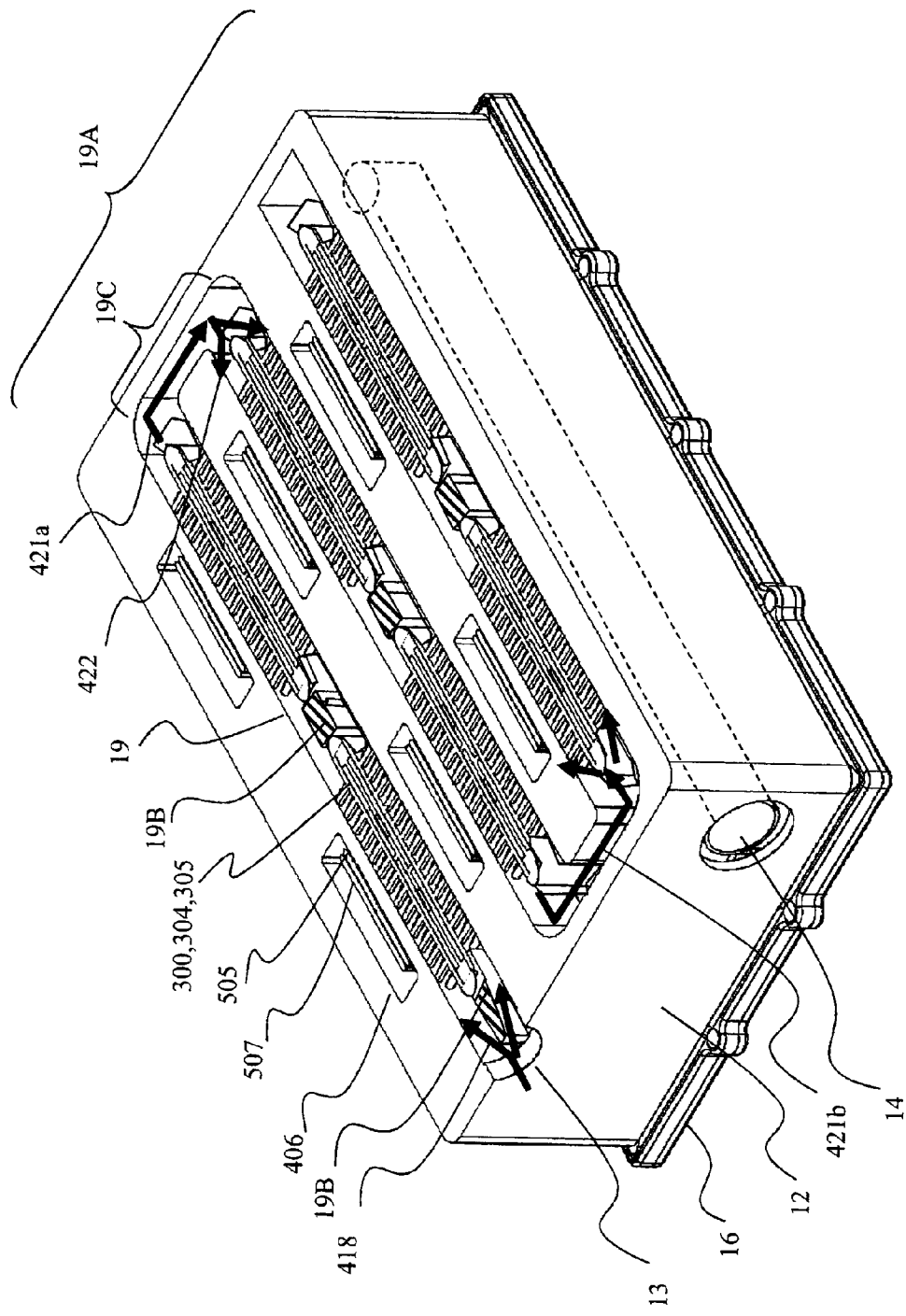
FIG. 15 is a perspective cross sectional view of a casing 12 that is made by aluminum casting and that is provided with a cooling jacket 19A, to which a cooling water inlet conduit and an outlet conduit are fitted.

In FIGS. 13 through 15, the reference symbol 200 denotes a power conversion device, 10 denotes an upper casing portion, 11 denotes a metallic base plate, 12 denotes a casing, 13 denotes a cooling water inlet conduit, 14 denotes a cooling water outlet conduit, 420 denotes a flow conduit rear lid, 16 denotes a lower casing portion, 17 denotes an AC terminal case, 18 denotes AC output wiring, 19 denotes a cooling water flow conduit, and 20 denotes a control circuit board. 21 denotes a connector for connection to the exterior, and 22 denotes a driver circuit board that holds a driver circuit 174. The control circuit board 20, the control circuit 172, the drive circuit board 22, and the driver circuit 174 constitute a control unit in this manner. The reference symbol 300 denotes a power module (a double sided electrode module), of which three are provided to each inverter circuit unit, with one set of these power modules 300 constituting the inverter circuit unit 142, while the other set of these power modules 300 constitutes the inverter circuit unit 140. And 700 denotes a laminated conductor plate, 800 denotes a seal member, 304 denotes a can shaped heat dissipation base, 314 denotes a DC positive electrode wiring board, 316 denotes a DC negative electrode wiring board, 500 denotes a capacitor module, 504 denotes a positive electrode side capacitor terminal, 506 denotes a negative electrode side capacitor terminal, and 514 denotes a capacitor cell.

FIG. 13 is an external perspective view showing the power conversion device 200 according to this embodiment of the present invention. This visible external portion of the power conversion device 200 includes a casing 12 whose upper surface and bottom surface are approximately rectangular, a cooling water inlet conduit 13 and a cooling water outlet conduit 14 that are provided on the external surface of the casing 12 at one of its short ends, an upper casing portion 10 for closing an upper aperture portion of the body 12, and a lower casing portion 16 for closing a lower aperture portion of the body 12. By making the shapes of the upper surface and of the bottom surface of the casing 12 as approximately rectangular, fitting the casing 12 to the vehicle becomes simple and easy, and moreover there is the beneficial effect that its manufacture, in particular by mass production, becomes easy.

An AC terminal case 17 for connection to the motor-generators 192 and 194 is provided on a long side of the outer surface of the power conversion device 200. And AC output wiring 18 electrically connects between the power modules 300 and the motor-generators 192 and 194.

The connector 21 is connected to the control circuit board 20 that is housed within the casing 12. Signals of various types from the exterior are transmitted via this connector 21 to the control circuit board 20. A DC negative electrode side connection terminal portion 510 and a DC positive electrode side connection terminal portion 512 are electrically connected to the battery 136 and to the capacitor module 500. Here, in this embodiment, the connector 21 is provided on the outer surface of the body 12 at one of its short ends. On the other hand, the DC negative electrode side connection terminal portion 510 and the DC positive electrode side connection terminal portion 512 are provided on the outer surface of the casing 12 at its short end that is opposite to its end on which the connector 21 is provided. In other words, it is arranged for the connector 21 and the DC negative electrode side connection terminal portion 510 to be separated from one another. Due to this, it is possible to reduce noise that enters into the casing 12 from the DC negative electrode side connection terminal portion 510 and/or the DC positive electrode side connection terminal portion 512 and that is further propagated as far as the connector 21, and so it is possible to enhance the controllability of the motor by the control circuit board 20. The DC connector 138 of FIG. 2 corresponds to this DC negative electrode side connection terminal portion 510 and this DC positive electrode side connection terminal portion 512.

FIG. 14 is a sectional view of this power conversion device according to an embodiment of the present invention. A cooling jacket 19A in which an internal flow conduit 19 is formed is provided within the casing 12, and pairs of opening portions 400 and 402 arranged along the direction of flow are formed in the upper portion of the cooling jacket 19A in three rows, thus constituting six opening portions in all. Each of the power modules 300 is fixed to the upper surface of the cooling jacket 19A via a seal member 800. The fins 305 of each of the power modules 300 are directly contacted with the cooling medium that flows in the flow conduit 19 of the cooling jacket 19A.

An opening portion 404 is formed on the lower surface of the cooling jacket 19A along the flow conduit 19, and this opening portion 404 is blocked by the flow conduit rear lid 420. Furthermore, the inverter 43 for auxiliary machinery is attached to the lower surface of the cooling jacket 19A, and thus is cooled by the cooling medium. The inverter 43 for auxiliary machinery is fixed to the lower surface of the flow conduit rear lid 420, in such a manner that heat dissipation metallic surfaces of power modules and so on that it houses internally (not shown in the figures) face the lower surface of the cooling jacket 19A. While in this embodiment the sealing member is a liquid seal, instead of a liquid seal, it would also be acceptable to substitute a resin material, an O-ring made from rubber, or a packing or the like; but in particular, if a liquid seal is employed, then it is possible the enhance the ease of assembly of this power conversion device 200.

Yet further, the lower casing portion 16 is provided below the cooling jacket 19A, and the capacitor module 500 is provided to this lower casing portion 16. The capacitor module 500 is fixed to a bottom inner surface plate of the lower casing portion 16 so that a heat dissipation surface of its metallic casing contacts this bottom inner surface plate of the lower casing portion 16. With this construction, it is possible to cool the power module 300 and the conversion device 43 for auxiliary machinery with good efficiency by utilizing the upper surface and the lower surface of the cooling jacket 19A, and this leads to making the entire power conversion device more compact.

Moreover, by the casing 12 to which the cooling jacket 19A is provided being cooled, the lower casing portion 16 that is provided to the lower portion of the casing 12 is also cooled. As a result, the heat from the capacitor module 500 is thermally conducted to the cooling water via the lower casing portion 16 and the casing 12, so that the capacitor module 500 is cooled.

The laminated conductor plate 700 is provided above the power module 300, for electrically connecting together the power module 300 and the capacitor module 500. This laminated conductor plate 700 straddles the input terminals 315 and 317 of the power modules 300, and thereby connects the power modules 300 in parallel. Furthermore, this laminated conductor plate 700 includes a positive electrode side conductor plate 702 that is connected to the positive electrode conductor plate 507 of the capacitor module 500, a negative electrode side conductor plate 704 that is connected to the negative electrode conductor plate 505 of the capacitor module 500, and a insulation sheet that is disposed between these conductor plates 702 and 704. Due to these conductor plates 505 and 507 being arranged so that they pierce through one of the water conduit dividing walls that are created by the meandering of the flow conduit of the cooling jacket 19A, it is possible to anticipate reduction of the parasitic inductances from the power modules 300 to the capacitor module 500, because it is thereby possible to shorten the length of the wiring between them.

The control circuit board 20 and the drive circuit board 22 are disposed above the laminated conductor plate 700. And the driver circuit 174 shown in FIG. 2 is mounted upon the drive circuit board 22, while the control circuit 172 that includes the CPU shown in FIG. 2 is mounted upon the control circuit board 20. Moreover, the metallic base plate 11 is disposed between the drive circuit board 22 and the control circuit board 20. This metallic base plate 11, along with having the function of electromagnetically shielding the circuit groups that are mounted upon the two boards 22 and 20, also has the function of conducting away heat that is generated by the drive circuit board 22 and by the control circuit board 20, thus performing cooling.

By providing the cooling jacket 19A in the central portion of the casing 12 in this manner, by disposing the power modules 300 for driving the motor-generators 192 and 194 on one side thereof, and by also disposing the inverter device (power module) 43 for auxiliary machinery on the other side thereof, it is possible to provide cooling with good efficiency in a small space, and thus it becomes possible to make the power conversion device as a whole more compact. By forming the cooling jacket 19A integrally with the casing 12 by aluminum casting, in addition to a beneficial effect for cooling the cooling jacket 12A, also there is the beneficial effect that the mechanical strength is improved. Furthermore, the conduction of heat becomes good because the casing 12 and the cooling jacket 19A are formed as one integral construction by aluminum casting, and the efficiency for cooling the drive circuit board 22, control circuit board 20 and capacitor module 500 from the cooling jacket 19A, that is in a position remote from them, is enhanced.

Flexible wiring 23 that passes through the metallic base plate 11 and establishes connection to the circuit boards 20 and 22 is provided to the drive circuit board 22 and to the control circuit board 20. This flexible wiring 23 has a structure that it is laminated within the circuit boards in advance, that it is adhered by a joining material such as solder or the like to conductor patterns on the upper portions of the circuit boards, and that further it is adhered to the circuit board for the electrodes of the flexible wiring 23 being pierced through holes provided in advance in the circuit boards by a joining material such as solder or the like; and, via this flexible wiring 23, switching timing signals for the inverter circuit are transmitted from the control circuit board to the drive circuit board 22, and the drive circuit board 22 generates gate drive signals and supplies them to the gate electrodes of each of the power modules. By employing the flexible wiring 23 in this manner, the connector heads that were used in the prior art become unnecessary, so that it becomes possible to improve the efficiency for implementing the circuit boards and to reduce the number of components, and thereby it is possible to make the inverter more compact. Furthermore, the connector 21 that performs electrical connection to the exterior is connected to the control circuit board 20. Using this connector 21, signal transmission from the in-vehicle battery 136, i.e. from the lithium battery module, that is provided externally to the power conversion device is carried out. Signals are sent from the lithium battery module to the control circuit board specifying the state of the battery, the states of charge of its lithium cells, and so on.

Openings are formed at the upper side portion and at the lower side portion of the casing 12. These openings are respectively blocked by fixing the upper casing portion 10 and the lower casing portion 16 to the casing 12 by engagement components, for example by screws or bolts or the like. The cooling jacket 19A, in which the flow conduit 19 is provided, is formed in the interior of the casing 12 at approximately the center thereof in the height direction. The flow conduit 19 is formed in the interior of the cooling jacket 19A so that openings in the upper surface of the cooling jacket 19A are blocked by the power modules 300, while openings in the lower surface thereof are covered over by the flow conduit rear lid 420. Water leakage testing for the flow conduit 19 is performed during assembly. And, after this water leakage testing has been passed, the work is undertaken of attaching the boards and the capacitor module 500 from the openings in the upper portion and in the lower portion of the casing 12. The productivity is enhanced by employing this construction in which the cooling jacket 19A is disposed in the center of the casing 12, through which construction the next work of fixing the necessary components from the openings in the upper side portion and in the lower side portion of the casing 12 is enabled. Moreover, it becomes possible to attach the other components after the flow conduit 19 has been initially completed, and after the water leakage testing has been performed, so that both the productivity and the reliability are enhanced.

FIG. 15 is a perspective cross sectional view of this casing 12 that is made by aluminum casting and that is provided with the cooling jacket 19A to which the cooling water inlet conduit and the cooling water outlet conduit are fitted. In FIG. 15, cooling water that flows into the flow conduit 19 from the cooling water inlet conduit 13 is divided into two flows along one long side of the rectangular shape in the direction shown by the arrow sign 418, turns back as shown by the arrow sign 421a at the corner portions 19C in the neighborhood just before the short side at the far end of the rectangle, flows back for a second time while being divided into two flows along the long side of the rectangle as shown by the arrow sign 422, again turns back along the long side of the rectangle as shown by the arrow sign 421b, yet again turns back and flows into an outlet conduit that is provided in the lower cooling water path lid 420, and then flows out into the cooling water inlet conduit 14 from the outlet aperture.

The pairs of opening portions 400 and 402 in the upper portion of the cooling jacket 19A are provided in three rows, thus constituting six opening portions in all. Since the branching points of the flow conduit past which the cooling water flows are formed smoothly, due to the fact that each of the power modules 300 projects from its corresponding opening portion into the flow of the cooling medium, due to the curved portions 304A provided to the can type cooling devices 304, and due to flow separation boundary portions 19B that are also provided, accordingly the pressure losses can be reduced. Since it is possible to reduce the pressure losses at the points where the cooling medium flow is divided into two by making the curved portions 304A of the can type cooling devices 304 as curved surfaces, accordingly it is possible to reduce the increase of pressure loss even though the flow conduit meanders in the shape of a letter S, so that it is possible to improve the cooling efficiency.

Embodiment 2

Figure 11:
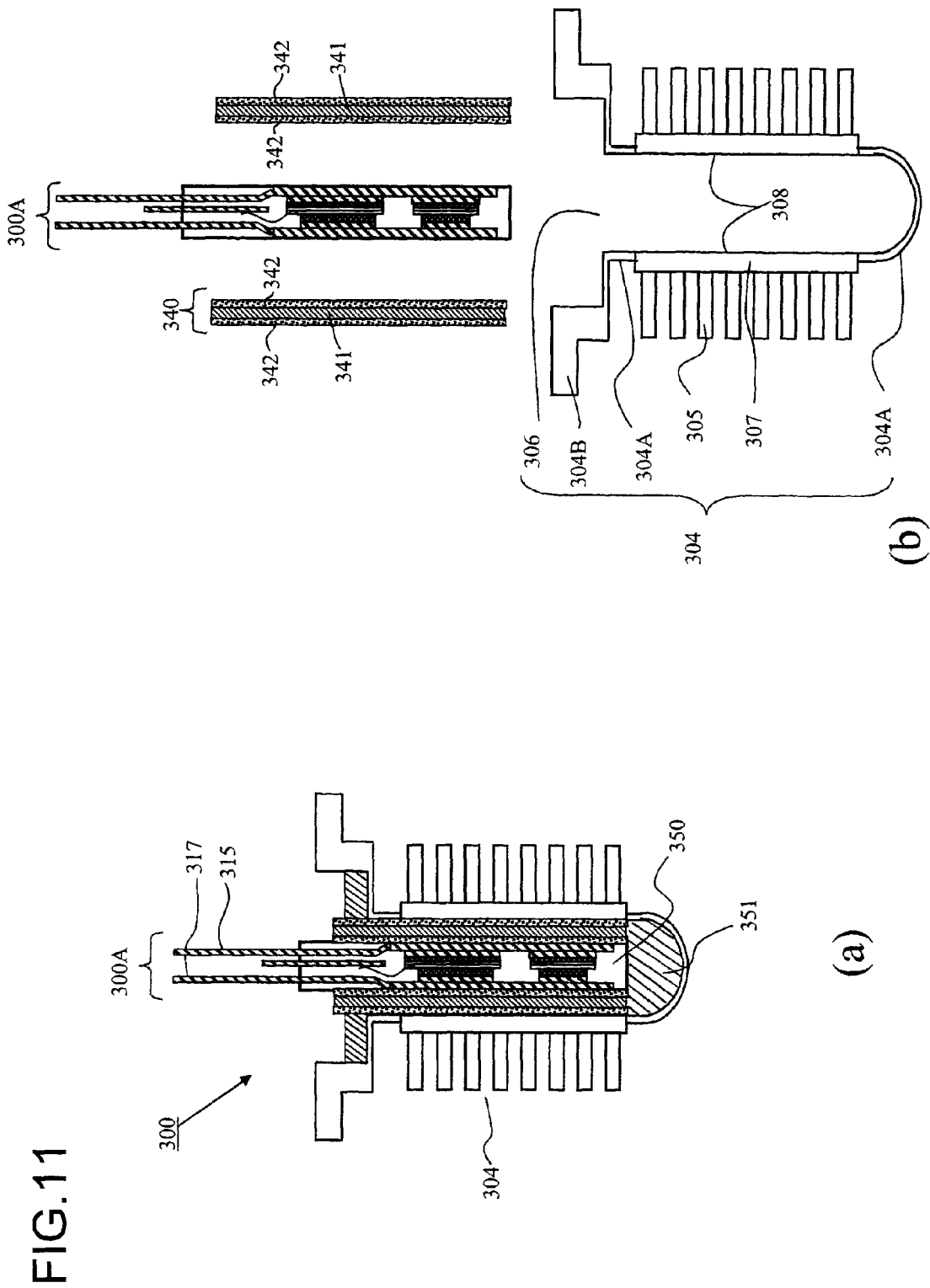
FIG. 11(*a*) is a sectional view of a power module 300 according to another embodiment, and FIG. 11(*b*) is an exploded sectional view of this power module 300 according to another embodiment.

FIG. 11(a) is a sectional view of a power module 300 according to another embodiment, and FIG. 11(b) is an exploded sectional view of this power module 300 according to another embodiment. While the portions that differ from the first embodiment are explained below, structures to which the same reference symbols are appended as in the first embodiment have the same functions.

In this embodiment, instead of the insulation sheets 333 according to the first embodiment, aluminum insulation plates 340 are provided. Thin insulating resin layers 342 having good adhesive quality are formed on both of the principal surfaces of each of these aluminum insulation plates 340. An alumite plate 341 is sandwiched between these two layers 342 of insulating resin, and moreover alumite processing is performed upon the entire assembly, so that alumite layers 601 are formed upon its front and rear surfaces. The alumite plate 341 and the two insulating resin layers 342 are adhered together by thermocompression bonding.

The primary sealed module unit 300A and the aluminum insulation plates 340 are solidly adhered together by the insulating resin layers 342 that are formed upon the aluminum insulation plate 340. In a similar manner, the interior plane surfaces 308 of the can type cooling device 304 upon which alumite processing has been performed and the aluminum insulation plates 340 are solidly adhered together by the insulating resin layers 342 that are formed upon the aluminum insulation plates 340.

Figure 12:
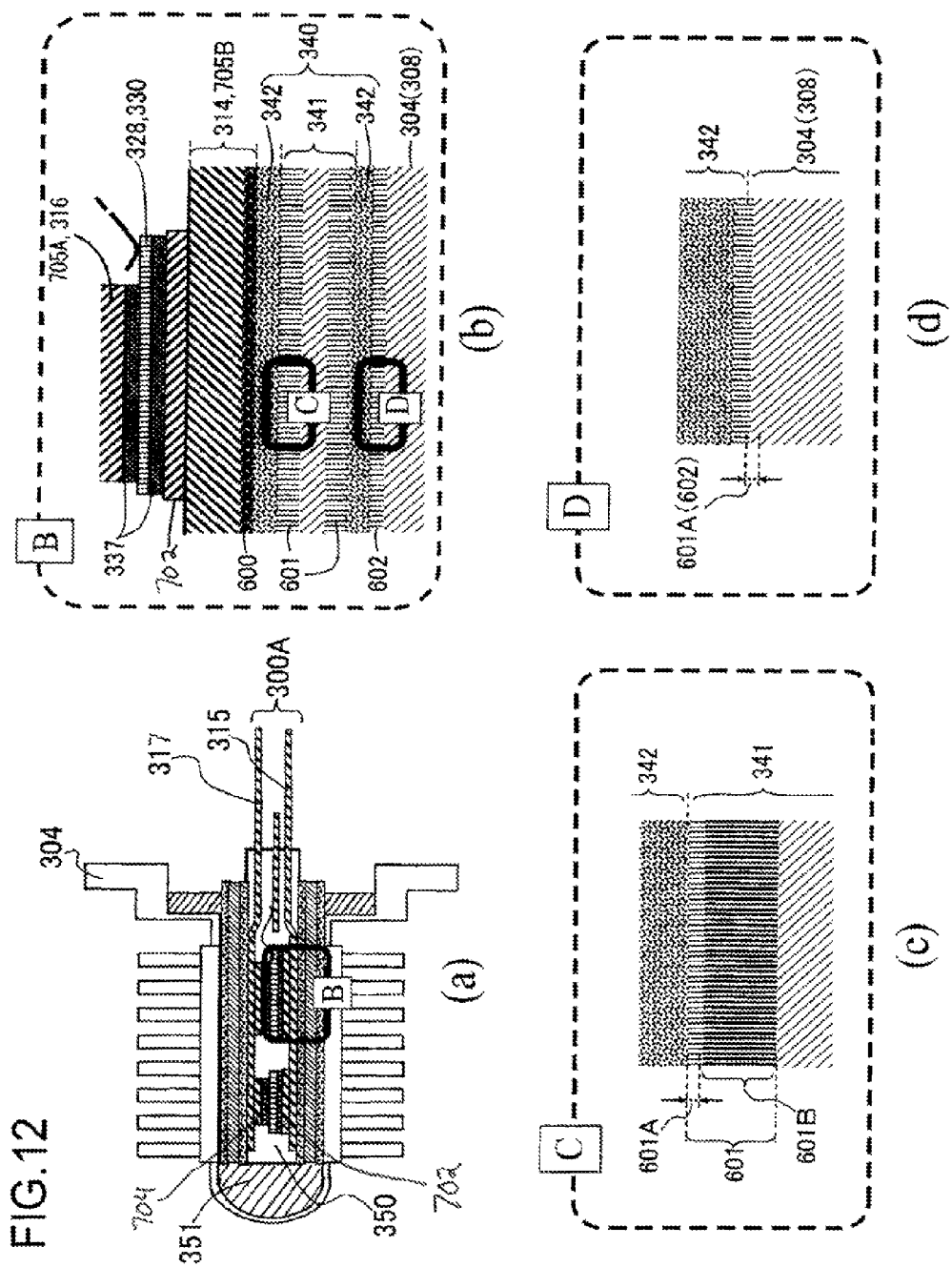
FIGS. 12(*a*) through 12(*d*) are detailed sectional views of adhesion interfaces between an aluminum insulation plate 340 of the power module 300, electrical wiring boards, and a can type cooling device 304.

FIGS. 12(a) through 12(d) are detailed sectional views of the adhesion interfaces between an aluminum insulation plate 340 of the power module 300, the various electrical wiring boards (the DC positive electrode wiring board 314, the DC negative electrode wiring board 316, the first AC wiring board 705A1, and the second AC wiring board 705B), and the can type cooling device 304. FIG. 12(b) is a detailed sectional view showing the portion B of FIG. 12(a) as enlarged; FIG. 12(c) is a detailed sectional view showing the portion C of FIG. 12(b) as enlarged; and FIG. 12(d) is a detailed sectional view showing the portion D of FIG. 12(b) as enlarged.

As shown in FIG. 12(b), alumite layers 601 and 602 are formed on both of the principal surfaces of the alumite plate 341. As shown in FIG. 12(c), in the alumite layer 601 on the side of the alumite plate 341 that is closer to the power semiconductor elements, there are formed both an inorganic acid type alumite layer 601A and an organic acid type alumite layer 601B. The inorganic acid type alumite layer 601A is formed on the side that is closer to the insulating resin layer 342.

On the other hand, as shown in FIG. 12(d), only an inorganic acid type alumite layer 601A is formed upon the interior plane surfaces 308 of the can type cooling device 304, and this inorganic acid type alumite layer 601A is adhered to the insulating resin layer 342 of the aluminum insulation plate 340.

It should be understood that, since no hole sealing processing is formed upon any of these alumite layers 601, accordingly both a beneficial effect of anchoring and also a compounding force due to chemical combination are created at the adhesion interfaces because of the thin insulating resin layer 342 entering into the holes in the inorganic acid type alumite layer 601A due to the thermocompression bonding, so that the adhesion becomes solid.

Yet further, since the thickness of the organic acid type alumite layer 601B that is provided below the inorganic acid type alumite layer 601A is greater than the thickness of the inorganic acid type alumite layer 601A, accordingly the insulation withstand voltage is excellent. Moreover, an insulation layer is formed due to the insulating resin layer 342 and the organic acid type alumite layer 601B being a double layer, and also this double insulation layer is formed on both the sides of the aluminum insulation plates 340.

Since, according to this embodiment as described above, the organic acid type alumite layer 601B is provided upon the aluminum insulation plate 340 as separated into two layers, accordingly it is possible greatly to enhance the insulation withstand voltage. Moreover, since it is possible to reduce the thickness of the insulating resin layer 342 by the extent of the organic acid type alumite layer 601B that has enhanced the insulation withstand voltage, accordingly it is possible greatly to reduce the thermal resistance while still maintaining the insulation reliability. Furthermore, it is not necessary to form the organic acid type alumite layers 601B upon the interior plane surfaces 308 of the can type cooling device 304. In other words, it is possible greatly to enhance the productivity, since it is possible to form the organic acid type alumite layer 601B upon the aluminum insulation plate 340, that is a separate member from the can type cooling device 304.

Embodiment 3

Figure 16:
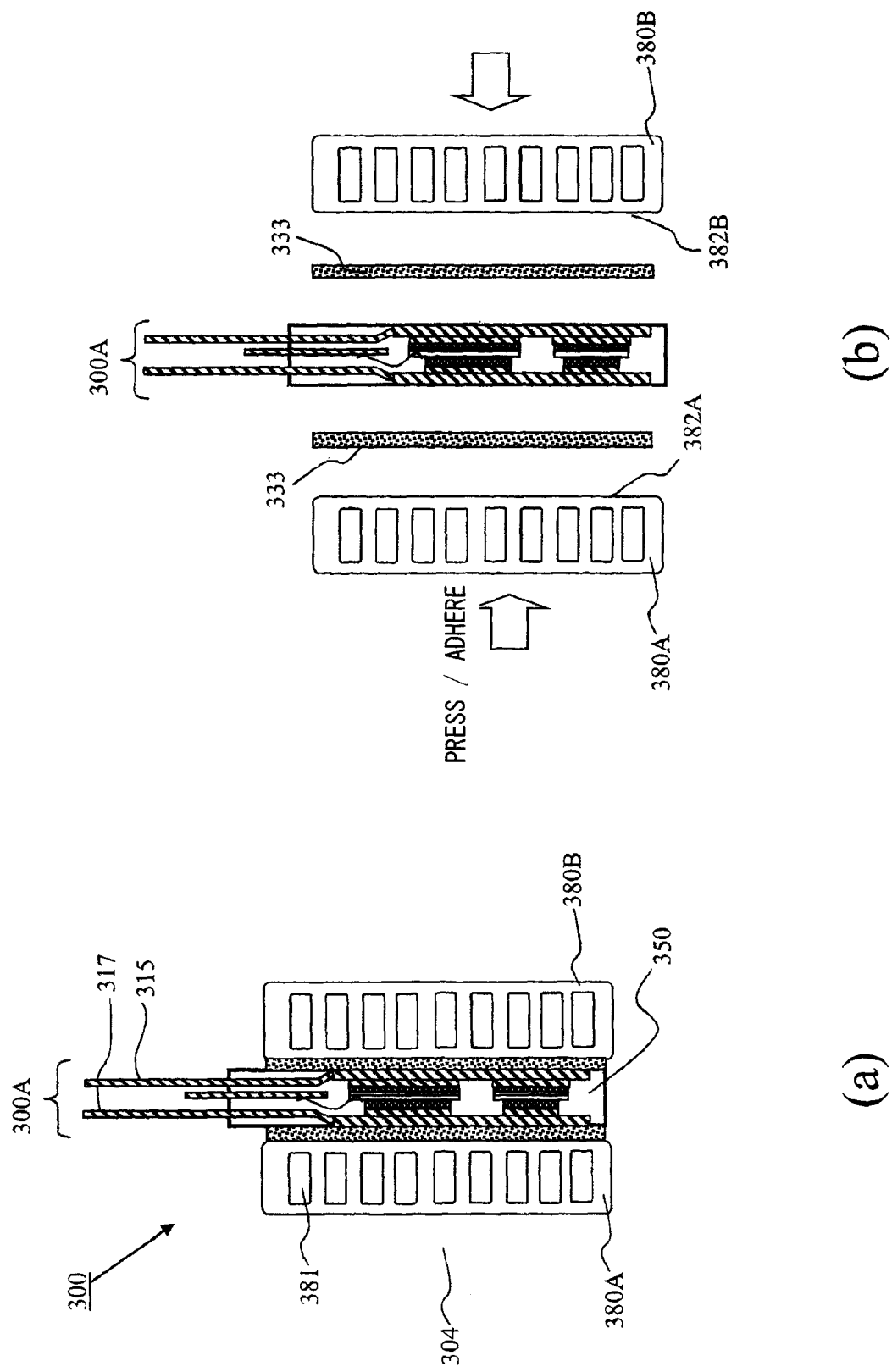
FIG. 16(*a*) is a sectional view of a power module 300 according to another embodiment, and FIG. 16(*b*) is a sectional view during assembly of this power module 300 according to another embodiment.

FIG. 16(a) is a sectional view of a power module 300 according to another embodiment, and FIG. 16(b) is a sectional view of this power module 300 according to another embodiment during assembly. While the portions that differ from the first embodiment are explained below, structures to which the same reference symbols are appended as in the first embodiment have the same functions.

In this embodiment, instead of the can type cooling device 304 according to the first and second embodiment, flow conduit defining members 380A and 380B are employed within which internal flow conduits 381 are defined. As shown in FIG. 16(b), alumite processing as explained for the first embodiment is performed upon the surfaces 382A and 382B of these flow conduit defining members 380A and 380B that contact against the insulation sheets 333.

Due to this, it is not necessary to form the organic acid type alumite layer 601B upon the interior plane surfaces 308 of the can type cooling device 304 shown for the first embodiment. In other words, since it is possible to form the organic acid type alumite layer 601B upon the flow conduit defining members 380A and 380B that are separate elements from the can type cooling device 304, accordingly it is possible greatly to enhance the productivity without decreasing the cooling performance.

Embodiment 4

Figure 17:
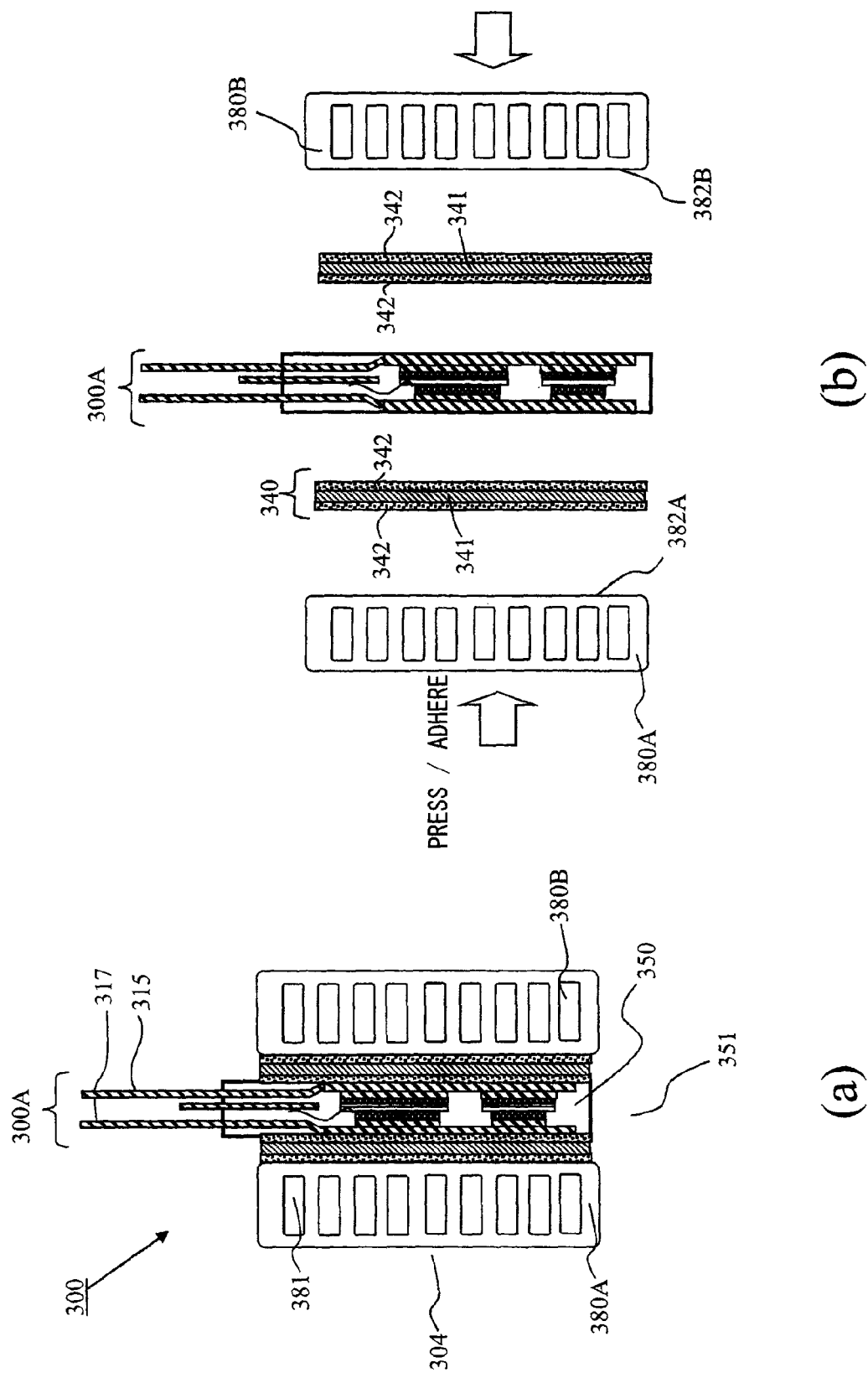
FIG. 17(*a*) is a sectional view of a power module 300 according to another embodiment, and FIG. 17(*b*) is a sectional view during assembly of this power module 300 according to another embodiment.

FIG. 17(a) is a sectional view of a power module 300 according to another embodiment, and FIG. 17(b) is a sectional view of this power module 300 according to another embodiment during assembly.

In this embodiment, instead of the insulation sheet 333 according to the third embodiment, the aluminum insulation plate 340 that was explained in connection with the second embodiment is employed. Since, as explained in connection with the second embodiment, the organic acid type alumite layer is formed in two layers upon the aluminum insulation plate 340, accordingly the inorganic acid type alumite layer is only formed upon the surfaces 382A and 382B on the side of the flow conduit defining member 380A. Due to this, it is possible greatly to enhance the productivity, since it is sufficient to form the organic acid type alumite layer only upon the aluminum insulation plate 340.

While various embodiments and variant embodiments have been explained in the above description, the present invention is not to be considered as being limited by the details thereof. Other modes that are considered to be within the scope of the technical concept of the present invention are also included within the range of the present invention.

The contents of the disclosure of the following application, upon which priority is claimed, are hereby incorporated herein by reference:

Japanese Patent Application 2009-108653 (filed on 28 Apr. 2009).

The invention claimed is:

1. A power module, comprising:
a semiconductor element for converting DC current to AC current by switching operation;
an electrical wiring board to which the semiconductor element is electrically connected, with the semiconductor element being disposed upon one of principle surfaces of the electrical wiring board;
an insulating resin layer provided on another principal surface of the electrical wiring board;
a first alumite layer that is formed by first alumite processing and is disposed on an opposite side of the electrical wiring board from the semiconductor element, separated by the insulating resin layer, and that is joined to the insulating resin layer;
a second alumite layer that is formed by second alumite processing and is disposed on an opposite side of the insulating resin layer from the semiconductor element, separated by the first alumite layer, and that ensures electrical insulation of the semiconductor element; and
a metallic heat dissipation member that is disposed on an opposite side of the second alumite layer from the first alumite layer, separated by the second alumite layer, and that radiates heat generated by the semiconductor element via the electrical wiring board, the insulating resin layer, the first alumite layer, and the second alumite layer;
wherein a hole diameter of the first alumite layer is greater than a hole diameter of the second alumite layer; and
wherein a thickness of the second alumite layer is greater than a thickness of the first alumite layer.

2. A power module according to claim 1 wherein:
the metallic heat dissipation member is made from an aluminum alloy;
the first alumite layer is formed upon the metallic heat dissipation member by performing the first alumite processing of an inorganic acid type upon the metallic heat dissipation member; and the second alumite layer is formed upon the metallic heat dissipation member by performing the second alumite processing of an organic acid type upon the metallic heat dissipation member.

3. A power module according to claim 2, wherein the second alumite processing of the organic acid type that is performed for the second alumite layer is alumite processing with oxalic acid.

4. A power module according to claim 1, wherein the electrical wiring board is made from a Cu alloy, and, on the one of the principal surfaces of the electrical wiring board that faces the insulating resin layer, is subjected to oxidization processing such as roughening processing or blackening processing.

5. A power module, comprising:
a semiconductor element for converting DC current to AC current by switching operation;
a first electrical wiring board, arranged so as to oppose a first electrode that is on one side of the semiconductor element, and electrically connected to the semiconductor element;
a second electrical wiring board, arranged so as to oppose a second electrode that is on another side of the semiconductor element, and electrically connected to the semiconductor element;
insulating resin layers disposed on both sides of the semiconductor element, with the first and second electrical wiring boards being arranged between the semiconductor element and a respective insulating resin layer;
a first alumite layer formed by first alumite processing for adhering to the insulating resin layer, separated by the insulating resin layer;
a second alumite layer for ensuring electrical insulation of the semiconductor element, separated by the first alumite layer; and
metallic heat dissipation members for radiating heat generated by the semiconductor element, disposed on both sides of the semiconductor element, each separated by the first electrical wiring board or the second electrical wiring board, the insulating resin layer, the first alumite layer, and the second alumite layer;
wherein a hole diameter of the first alumite layer is greater than a hole diameter of the second alumite layer; and
wherein a thickness of the second alumite layer is greater than a thickness of the first alumite layer.

6. A power module according to claim 5, wherein:
the metallic heat dissipation member is made from an aluminum alloy;
the first alumite layer is formed upon the metallic heat dissipation member by performing the first alumite processing of an inorganic acid type upon the metallic heat dissipation member; and
the second alumite layer is formed upon the metallic heat dissipation member by performing a second alumite processing of an organic acid type upon the metallic heat dissipation member.

7. A power module according to claim 5, wherein the first electrical wiring board and the second electrical wiring board are made from a Cu alloy, and, on a principal surface of each of the first electrical wiring board and the second electrical wiring board that face the insulating resin layers, are subjected to oxidization processing such as roughening processing or blackening processing.

8. A power module, comprising:
a semiconductor element for converting DC current to AC current by switching operation;
a first electrical wiring board, arranged so as to oppose a first electrode that is on one side of the semiconductor element, and electrically connected to the semiconductor element;
a second electrical wiring board, arranged so as to oppose a second electrode that is on another side of the semiconductor element, and electrically connected to the semiconductor element;
a sealing resin mass that seals the semiconductor element, the first electrical wiring board, and the second electrical wiring board, so that portions of surfaces of the first electrical wiring board and the second electrical wiring board that do not face the semiconductor element are exposed;
a metallic casing having an aperture for insertion of the semiconductor element, the first electrical wiring board, and the second electrical wiring board, that is sealed by the sealing resin mass; and
an insulation sheet that is inserted between an exposed surface of the first electrical wiring board and the second electrical wiring board, and an inner wall of the metallic casing;
wherein, upon the metallic casing, a first alumite layer for adhering to the insulation sheet is formed upon a surface of the metallic casing that faces the insulation sheet and the metallic casing, and a second alumite layer is formed opposite from the insulation sheet, separated by the first alumite layer;
wherein a hole diameter of the first alumite layer is greater than a hole diameter of the second alumite layer; and
wherein a thickness of the second alumite layer is greater than a thickness of the first alumite layer.

9. A power module according to claim 8, wherein:
the metallic casing is made from an aluminum alloy;
the first alumite layer is formed upon the metallic casing by performing first alumite processing of an inorganic acid type upon the metallic casing; and
the second alumite layer is formed upon the metallic casing by performing second alumite processing of an organic acid type upon the metallic casing.

10. A power module according to claim 8, wherein the first electrical wiring board and the second electrical wiring board are made from a Cu alloy, and, on a principal surface of each of the first electrical wiring board and the second electrical wiring board that face the insulation sheet, are subjected to oxidization processing such as roughening processing or blackening processing.

* * * * *